(12) United States Patent
Takahashi et al.

(10) Patent No.: US 6,518,547 B2
(45) Date of Patent: Feb. 11, 2003

(54) HEAT TREATMENT APPARATUS

(75) Inventors: Mitsukazu Takahashi, Kyoto (JP); Hideo Nishihara, Kyoto (JP); Yoshio Ito, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 09/788,086

(22) Filed: Feb. 16, 2001

(65) Prior Publication Data

US 2001/0027969 A1 Oct. 11, 2001

(30) Foreign Application Priority Data

Apr. 6, 2000 (JP) ........................................ 2000-104604

(51) Int. Cl.$^7$ ................................................ F27B 5/14
(52) U.S. Cl. ...................... 219/390; 219/405; 219/411; 118/724; 118/50.1; 392/416; 392/418
(58) Field of Search ................................ 219/390, 405, 219/411; 118/724, 725, 50.1; 392/416, 418

(56) References Cited

U.S. PATENT DOCUMENTS 6,108,490 A * 8/2000 Lee et al. .................... 392/416
6,243,534 B1 * 6/2001 Sandhu ....................... 392/416

* cited by examiner

*Primary Examiner*—Teresa Walberg
*Assistant Examiner*—Shawntina T. Fuqua
(74) *Attorney, Agent, or Firm*—Ostrolenk, Faber, Gerb & Soffen

(57) ABSTRACT

A substrate heat treatment apparatus irradiating a substrate such as a semiconductor wafer with light and performing heat treatment is provided. 19 lamps 82 are arranged on a plane in the form of a honeycomb to form a lamp group 81. The lamp group 81 has 6-fold rotation symmetry about a symmetry axis XR. A substrate W is rotated about a rotation axis XW in a plane parallel to that formed by the lamp group 81. The symmetry axis XR of the lamp group 81 and the rotation axis XW of the substrate W are displaced for relaxing peaks and bottoms of illuminance distribution on the substrate W resulting from regularity of arrangement of the lamp group 81. Consequently, fluctuation of radial illuminance distribution on the substrate W is reduced and improving uniformity is improved. When the uniformity of radial illuminance distribution on the substrate W is improved, temperature uniformity of the substrate W in heat treatment can be ensured.

4 Claims, 18 Drawing Sheets

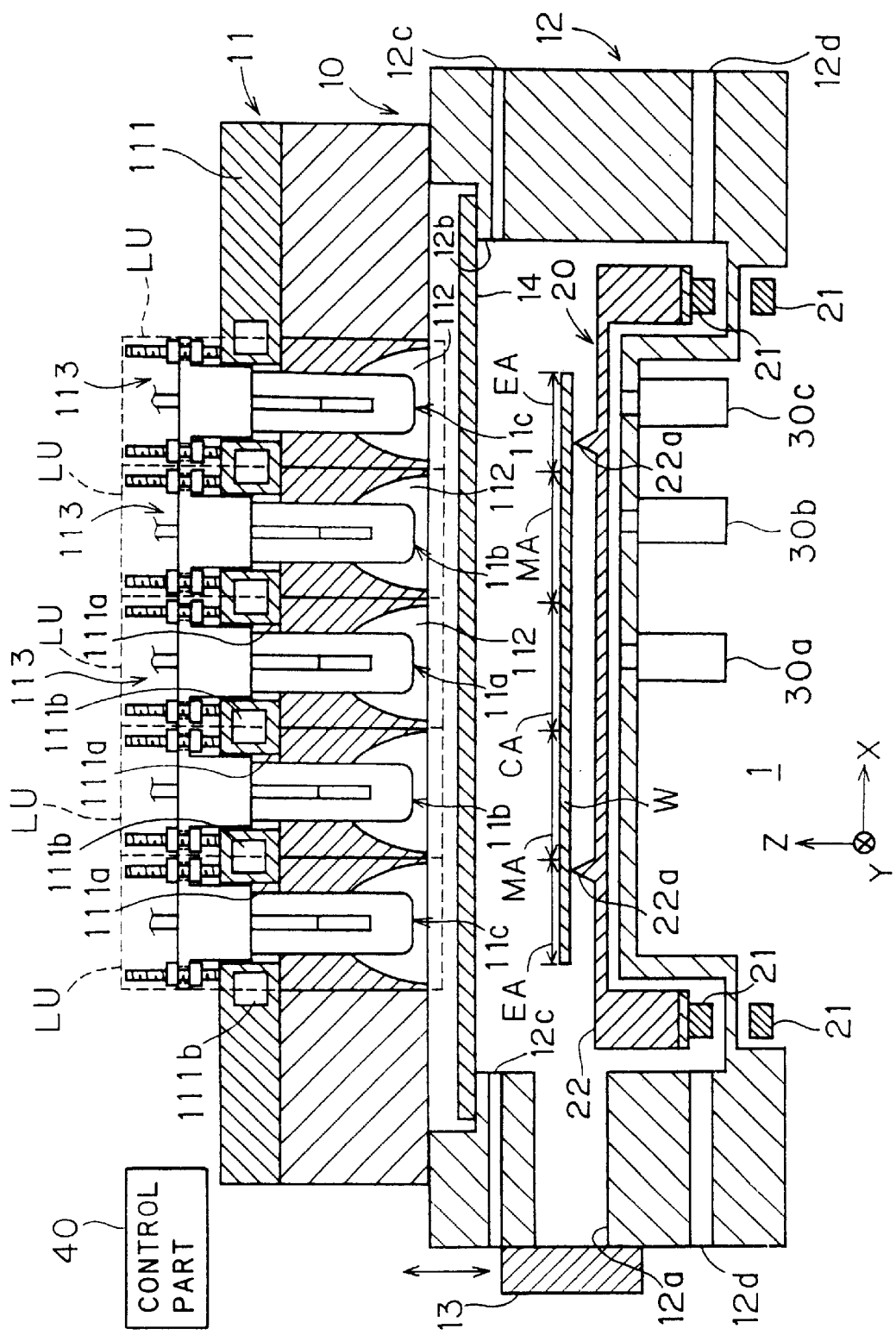

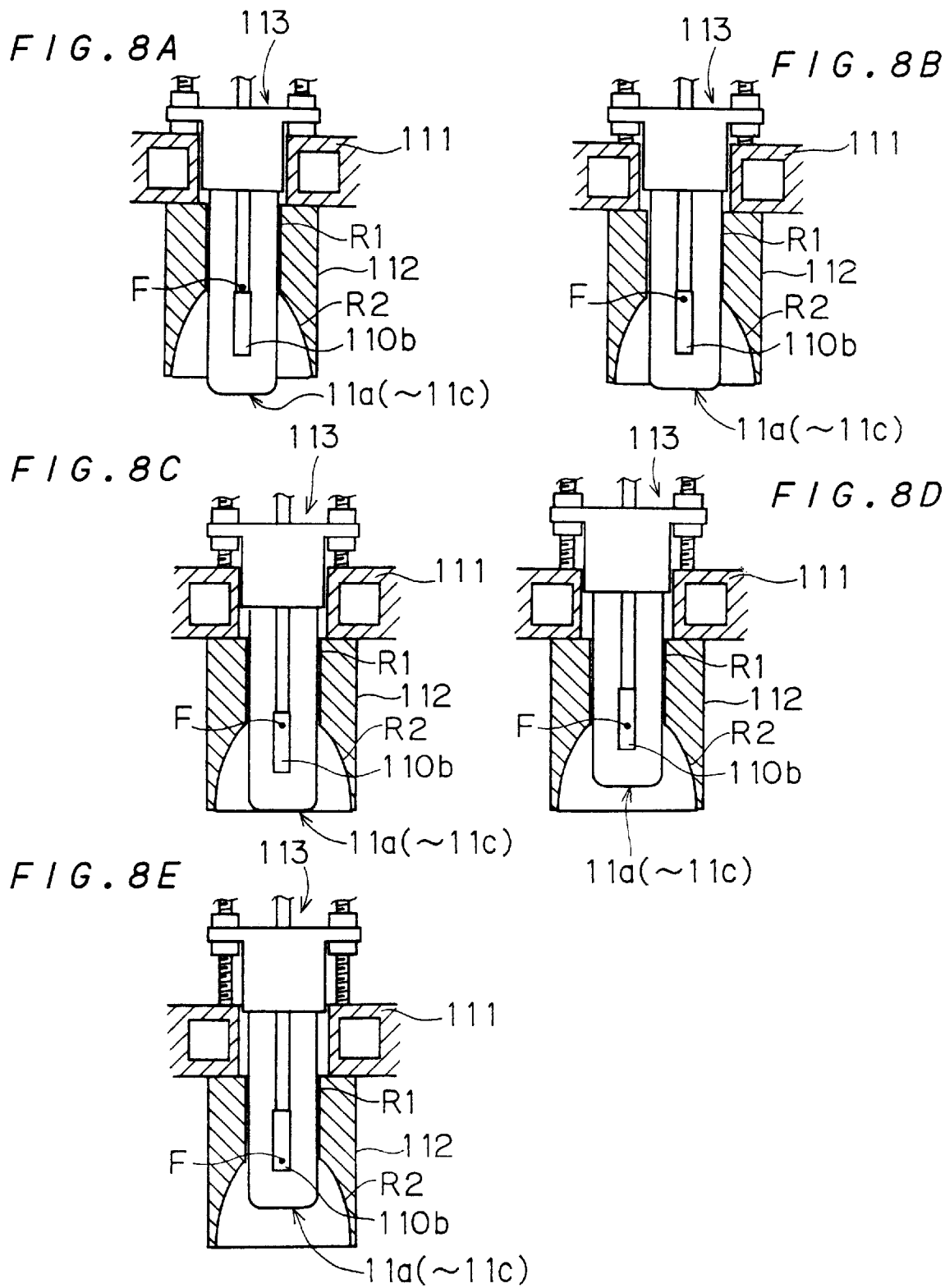

F/G. 9
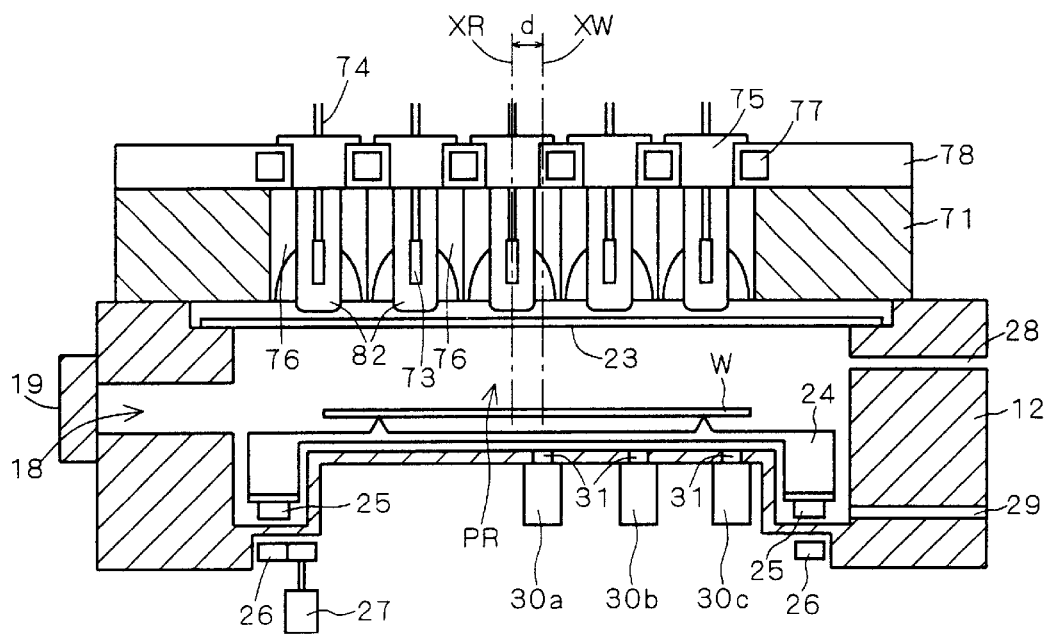
F/G. 10
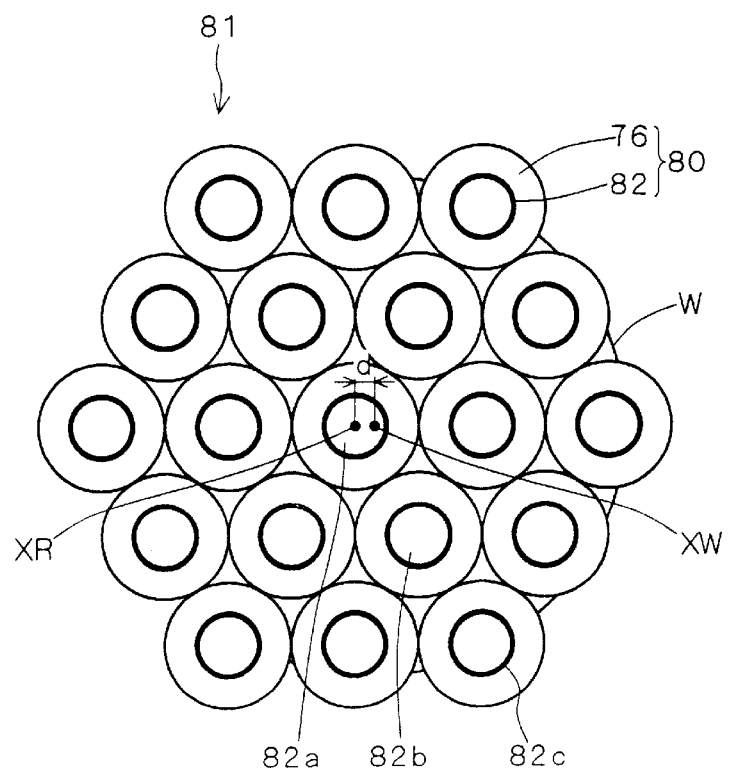

F / G. 20
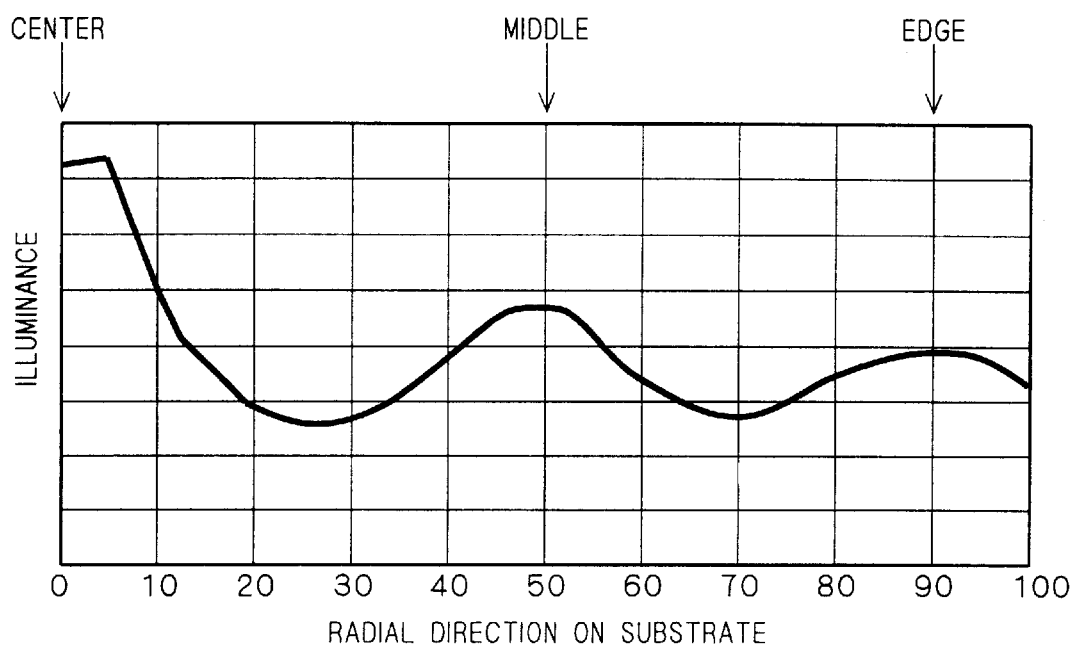

HEAT TREATMENT APPARATUS

BACKGROUND OF THE INVENTION

1. Field of the Invention

The present invention relates to a substrate heat treatment apparatus irradiating a substrate such as a semiconductor wafer, a glass substrate for a photomask, a glass substrate for a liquid crystal display or a substrate for an optical disk (hereinafter simply referred to as "substrate") for performing heat treatment.

2. Description of the Background Art

As refinement of a semiconductor device or the like is strictly required, a rapid heat treatment process referred to as an RTP (rapid thermal process) is watched with interest as one of heating steps for a substrate.

FIG. 17 is a longitudinal sectional view of a conventional RTP apparatus. In the RTP, the following treatment is performed with this apparatus: Lamps 91a, 91b and 91c are employed as heating sources, and treatment gas (e.g., nitrogen gas or oxygen gas) responsive to the treatment process is supplied into a treatment chamber 90 from a gas inlet port 90a for keeping the treatment chamber 90 in such a gas atmosphere, heating a substrate W to a desired temperature (up to about 1200° C.) in order of seconds, holding the substrate W at the temperature for a desired time (several 10 seconds) and thereafter turning off the lamps 91a to 91c and rapidly cooling the substrate W.

This apparatus, capable of preventing impurities from re-diffusion caused by heat in junction layers of transistors formed on the substrate W and forming an insulator film such as a thin oxide film, can perform treatment which has been hard to implement by conventional long-time high-temperature heat treatment with an electric furnace.

In the conventional apparatus, the cylindrical lamps 91a to 91c are embedded in a reflector 93 having a cylindrical reflecting surface 95 as shown in FIG. 17, in order to apply emitted light to the substrate W with a certain degree of directivity.

In general, however, light emitted from filaments 94 is mainly applied in a direction (hereinafter referred to as "side surface direction") perpendicular to the longitudinal direction of the filaments 94, i.e., in the direction (along an X-Y plane) of the cylindrical reflecting surface 95 of the reflector 93 in the apparatus shown in FIG. 17. In other words, the light is intensely applied toward the side surface direction and extremely weakly applied in the longitudinal direction (Z-axis direction) of the filaments 94. Therefore, most of the light emitted from the filaments 94 is multiple-reflected in the cylindrical reflecting surface 95 to thereafter outgo from the lower end of the cylindrical reflecting surface 95. Also in this case, the light mainly outgoes in the side surface direction, and the optical path toward the substrate W may be elongated to attenuate the light, leading to inferior heating efficiency for the substrate W.

Most of the light in the aforementioned side surface direction reaches the cylindrical reflecting surface 95, to be partially absorbed by the cylindrical reflecting surface 95. It follows that most of the light reflected by the cylindrical reflecting surface 95 returns to the lamps 91a, 91b and 91c, and hence the cylindrical reflecting surface 95 and the lamps 91a to 91c reserve heat to be deflected due to high temperatures or inhibit the halogen cycle of halogen gas in glass tubes 96 provided in the lamps 91a to 91c, leading to reduction of the lives of the lamps 91a to 91c.

In the RTP, temperature distribution in the substrate surface (X-Y plane) of the substrate W is desirably uniform. In order to improve temperature uniformity of the substrate W, therefore, radiation thermometers 92a, 92b and 92c are provided in correspondence to a center area CA, a middle area MA and an edge area EA respectively, for example, in the substrate surface for measuring the temperatures of the aforementioned areas CA, MA and EA respectively while the plurality of lamps 91a, 91b and 91c are provided in correspondence to the areas CA, MA and EA respectively for feedback-controlling power supplied to the lamps 91a to 91c for the areas CA, MA and EA so that the substrate temperatures on the respective areas CA, MA and EA match with each other.

However, the temperatures of intermediate portions between the center area CA and the middle area MA and between the middle area MA and the edge area EA, for example, are not measured, and these intermediate portions located between the areas CA, MA and EA cannot be selectively temperature-controlled. Therefore, the temperature of the substrate W is ununiform on these intermediate portions. Temperature ununiformity in these intermediate portions is further described.

FIG. 18 is a plan view showing lamp arrangement in the conventional RTP apparatus. This RTP apparatus comprises a lamp group 99 formed by 19 lamp units 98. Each lamp unit 98 is formed by a lamp 91 and a cylindrical reflecting surface 95. As shown in FIG. 18, the lamp group 99 is in honeycomb arrangement having six lamp units 98 adjacently provided around a single lamp unit 98. The lamp group 99 is arranged to cover the overall surface of a substrate W with the 19 lamps 91. The diameter of the substrate W is 200 mm.

In order to heat-treat the substrate W with the lamp group 99, each lamp 91 is supplied with power to emit light. The light outgoing from each lamp 91 reaches the substrate W directly or after reflected by the cylindrical reflecting surface 95, to heat the substrate W. At this time, the lamp group 99 is divided into three areas consisting of a center area formed by the centermost lamp 91, an edge area formed by 12 outermost lamps 91 and a middle area formed by six intermediately located lamps 91 for varying power supply patterns with the areas while rotating the substrate W, thereby ensuring inplane temperature uniformity of the substrate W.

However, the conventional heat treatment apparatus cannot ensure sufficient inplane temperature uniformity despite the aforementioned power supply control for each area and rotation of the substrate W. The reason for this is now described.

FIG. 19 illustrates illuminance distribution on the substrate W with a single lamp 91. Referring to FIG. 19, the left-end position (position of a distance zero) is a position immediately under the lamp 91 in the vertical direction on the substrate W. Symbol RP denotes the radius of the lamp 91.

While high illuminance is obtained on the position immediately under the lamp 91, illuminance on the substrate W tends to gradually lower as the distance from this position is increased. In other words, the light emitted from the lamp 91 has downward directivity due to the cylindrical reflecting surface 95 and hence substantially uniform high illuminance is obtained immediately under the lamp 91 (within the range of the diameter of the lamp 91), while illuminance of the light emitted from the lamp 91 lowers as the horizontal distance (direction parallel to the surface of the substrate W) from the lamp 91 is increased.

On the other hand, the 19 lamps 91 forming the lamp group 99 is arranged in the form of a honeycomb as described above, and it can be said that the 19 lamps 91 are arranged on concentric circles in another point of view. Therefore, the conventional heat treatment apparatus exhibits illuminance distribution shown in FIG. 20 also when rotating the substrate W.

FIG. 20 illustrates radial illuminance distribution on the substrate W in the conventional heat treatment apparatus. As shown in FIG. 20, a certain degree of illuminance is attained in positions on the substrate W under the aforementioned center area, the middle area and the edge area respectively, while illuminance lowers in positions under the intermediate portions between the areas. Each lamp 91 applies a sufficient quantity of light under the center area, the middle area and the edge area to increase illuminance due to the illuminance distribution of the light emitted from each lamp 91 shown in FIG. 19, while the quantity of light emitted from each lamp 91 is reduced to lower illuminance in the portions under the clearances between the areas. The substrate W is rotated when irradiated with light, and hence illuminance is substantially uniform in the same area to exhibit the illuminance distribution shown in FIG. 20 as to an arbitrary radial direction of the substrate W.

When the radial illuminance distribution on the substrate W is ununiform as shown in FIG. 20, in-plane temperature uniformity in the substrate W is disadvantageously damaged as a result.

SUMMARY OF THE INVENTION

The present invention is directed to a heat treatment apparatus irradiating a substrate with light for performing heat treatment.

According to the present invention, a heat treatment apparatus rotating a substrate and irradiating the substrate with light for performing heat treatment comprises a lamp group having a plurality of lamps, each irradiating the substrate with light, arranged to have n-fold rotation symmetry (n: natural number of at least 2) about a prescribed symmetry axis and a rotation driving part rotating the substrate about a rotation axis substantially parallel to the symmetry axis, while the symmetry axis and the rotation axis are displaced along a direction substantially parallel to the surface of revolution of the substrate.

Peaks and bottoms of illuminance distribution on the substrate resulting from regularity of arrangement of the lamp group are relaxed due to rotation of the substrate, whereby uniformity of radial illuminance distribution on the substrate is improved so that temperature uniformity of the substrate can be ensured in heat treatment.

According to a preferred embodiment of the present invention, the symmetry axis and the rotation axis are displaced by at least ⅕ and not more than ½ the interval of arrangement of the plurality of lamps.

Uniformity of radial illuminance distribution on the substrate is so remarkably improved that temperature uniformity of the substrate can be ensured in heat treatment.

According to another embodiment of the present invention, a heat treatment apparatus irradiating a substrate with light for performing heat treatment comprises a holding part holding the substrate and an irradiation part having a light source and a reflecting surface reflecting light emitted from the light source for irradiating the substrate held by the holding part with light, while the reflecting surface includes a cylindrical first surface having a symmetry axis in a direction substantially perpendicular to the substrate and a second surface connected on an end of the first surface closer to the substrate and spread on a side closer to the substrate.

Light reflected sideward by the end closer to the substrate after multiple-reflected in the cylinder of the first surface is also reflected by the second surface toward the substrate to be collected, whereby directivity of irradiation toward the substrate is excellent and heating efficiency for the substrate is improved while the light can be concentrated in the vicinity of a portion on the substrate corresponding to the light source, whereby temperature control on this portion is simplified. Further, a cylindrical portion is relatively small as compared with the case of forming the reflecting surface only by a cylindrical reflecting surface, whereby quantities of heat reserved in the light source and the reflecting surface are small and the lives thereof can be increased.

According to still another embodiment of the present invention, a heat treatment apparatus irradiating a substrate with light for performing heat treatment comprises a holding part holding the substrate, a light source opposed to the substrate held by the holding part for irradiating the substrate with light and a light source position control part capable of controlling the distance between the light source and the substrate held by the holding part.

The quantity of light applied to the periphery of a region of the substrate corresponding to the light source can be adjusted by controlling the distance between the light source and the substrate, whereby temperature uniformity of the substrate can be improved for performing high-quality heat treatment.

Accordingly, an object of the present invention is to provide a heat treatment apparatus capable of ensuring temperature uniformity of a substrate in heat treatment.

Another object of the present invention is to provide a heat treatment apparatus having excellent heating efficiency with a long life of a light source or the like.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a longitudinal sectional view of a heat treatment apparatus according to a second embodiment of the present invention;

FIGS. 8A to 8E show a filament of a lamp of the apparatus shown in FIG. 5 located on various positions;

FIG. 9 is a side sectional view showing the overall structure of a heat treatment apparatus according to a third embodiment of the present invention;

FIG. 10 is a plan view showing plane arrangement of lamps in the heat treatment apparatus shown in FIG. 9;

FIG. 20 illustrates radial illuminance distribution on a substrate in the RTP apparatus shown in FIG. 18.

DESCRIPTION OF THE PREFERRED EMBODIMENTS

<First Embodiment>

Figure 1:
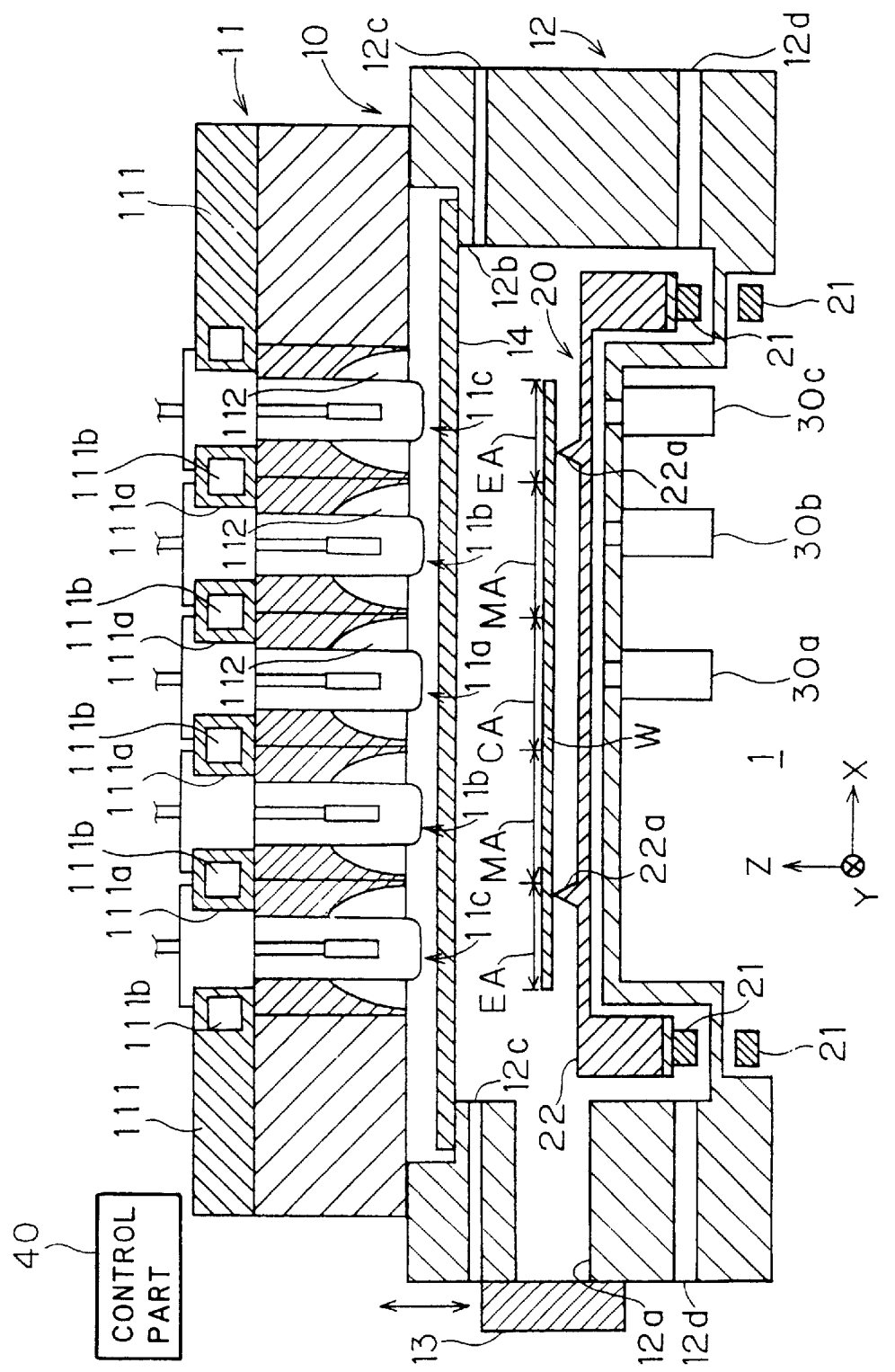
FIG. 1 is a longitudinal sectional view of a heat treatment apparatus according to a first embodiment of the present invention.

FIG. 1 is a longitudinal sectional view of a substrate heat treatment apparatus 1 according to a first embodiment of the present invention. The structure of the substrate heat treatment apparatus 1 is now described with reference to FIG. 1. In order to simplify the illustration, FIG. 1 shows X-, Y-, and Z-axes.

The substrate heat treatment apparatus 1 according to this embodiment mainly comprises a treatment chamber 10, a substrate holding/rotating part 20, radiation thermometers 30a to 30c and a control part 40.

The treatment chamber 10 is a cylindrical furnace body formed by an upper irradiation part 11 and a lower furnace wall 12. A number of lamps 11a to 11c are embedded in the irradiation part 11 corresponding to irradiation means of the present invention, for irradiating a substrate W with light when turned on for heating the substrate W.

A throat 12a having an opening/closing shutter 13 is provided on the side surface of the furnace wall 12, so that an external transport apparatus (not shown) introduces/discharges the substrate W when heat-treating the substrate W. A quartz glass plate 14 transmitting the light emitted from the irradiation part 11 is substantially horizontally (in parallel with the surface of the held substrate W) mounted on the furnace wall 12 under the irradiation part 11 to cover an opening 12b. Clearances between the throat 12a and the furnace wall 12 and between the quartz glass plate 14 and the furnace wall 12 are properly sealed with O-rings (not shown). The furnace wall 12 is provided with a gas inlet port 12c supplying treatment gas (e.g., nitrogen gas or oxygen gas) used for heat treatment and a discharge port 12d discharging the gas after treatment, so that the treatment chamber 10 is filled with the treatment gas previously introduced from the gas inlet port 12c when heat-treating the substrate W and the internal atmosphere is discharged from the discharge port 12d after the treatment.

The substrate holding/rotating part 20 mainly consists of magnetic couplings 21 magnetically coupled with each other while forming a prescribed magnetic field through the bottom portion of the furnace wall 12 and a holder 22 holding the substrate W on several points with holding members 22a, so a rotation driving mechanism (not shown) such as a motor rotates the magnetic couplings 21 for rotating the holder 22 along the vertical direction (Z-axis direction) thereby rotating the substrate W in a horizontal plane.

The radiation thermometers 30a to 30c measure radiation intensity (radiation energy) in consideration of multiple reflection of heat radiation from the substrate W, obtain the substrate temperatures on the basis thereof, and transmit temperature signals to the control part 40.

The control part 40, comprising a CPU and a memory therein, is electrically connected with the lamps 11a to 11c, the shutter 13, the rotation driving mechanism, the radiation thermometers 30a to 30c and the like for controlling power supplied to the lamps 11a to 11c through a lamp driver (not shown) on the basis of the temperature signals from the radiation thermometers 30a to 30c, controlling power supply to the aforementioned rotation driving mechanism for rotating/driving the magnetic couplings 21 and opening/closing the shutter 13.

Due to the aforementioned structure, the substrate heat treatment apparatus 1 performs the following treatment: First, the substrate heat treatment apparatus 1 rotates the substrate W in the horizontal plane while holding the substrate W externally introduced through the throat 12a on the substrate holding/rotating part 20 and filling the treatment chamber 10 with the treatment gas and emits light from the lamps 11a to 11c thereby performing heat treatment. After performing the heat treatment for a prescribed time, the substrate heat treatment apparatus 1 turns off the lamps 11a to 11c, cools the substrate W to a proper temperature in the treatment chamber 10 and thereafter discharges the same from the throat 12a. The substrate heat treatment apparatus 1 repeats such a series of processing on a plurality of substrates W at need.

The principal parts of the heat treatment apparatus 1 are now described in more detail.

The irradiation part 11 mainly includes the lamps 11a to 11c, a base plate 111 and reflectors 112. The base plate 111 is a discoidal member having a larger diameter than the substrate W, and is horizontally provided above the substrate W in opposition thereto to cover the overall surface of the substrate W held on the substrate holding/rotating part 20. A plurality of Z-directional cylindrical mounting holes 111a are provided on the base plate 111 while cooling passages, more specifically cooling tubes 111b feeding cooling water are provided in the base plate 111 between the mounting holes 111a. The cooling tubes 111b can quickly remove heat transmitted from the reflectors 112 as described later.

Figure 2:
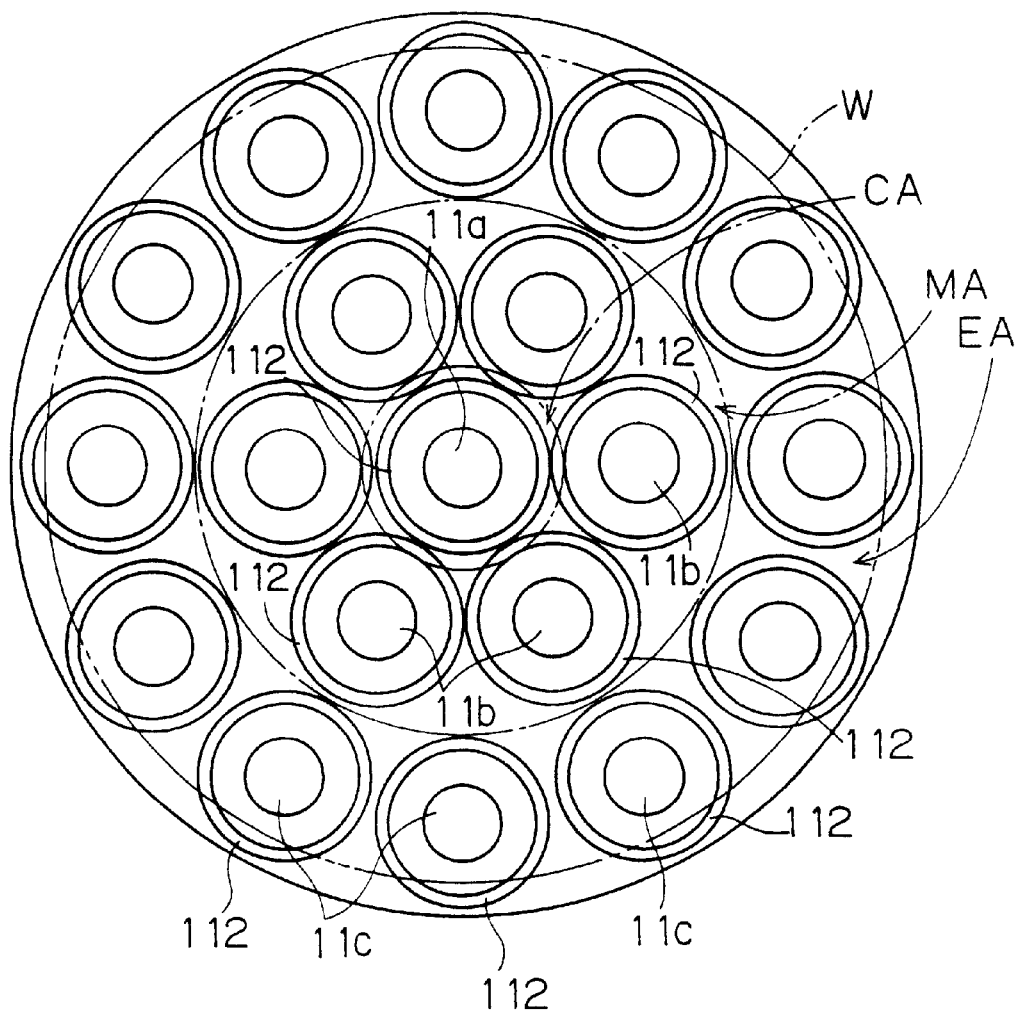
FIG. 2 illustrates an irradiation unit of the apparatus shown in FIG. 1 as viewed from below.

FIG. 2 shows the irradiation part 11 as viewed from below. As shown in FIG. 2, the mounting holes 111a are provided on the portion of the base plate 111 covering the substrate W substantially over the entire surface, and the lamps 11a to 11c are inserted in/mounted on the mounting holes 111a. Thus, the lamps 11a to 11c are located within a plane (X-Y plane) substantially parallel to the held substrate W.

As shown in FIGS. 1 and 2, the reflectors 112 are mounted on the peripheries of the mounting holes 111a of the base plate 111 respectively so that the upper ends thereof are in surface contact with the lower surface of the base plate 111.

Figure 3:
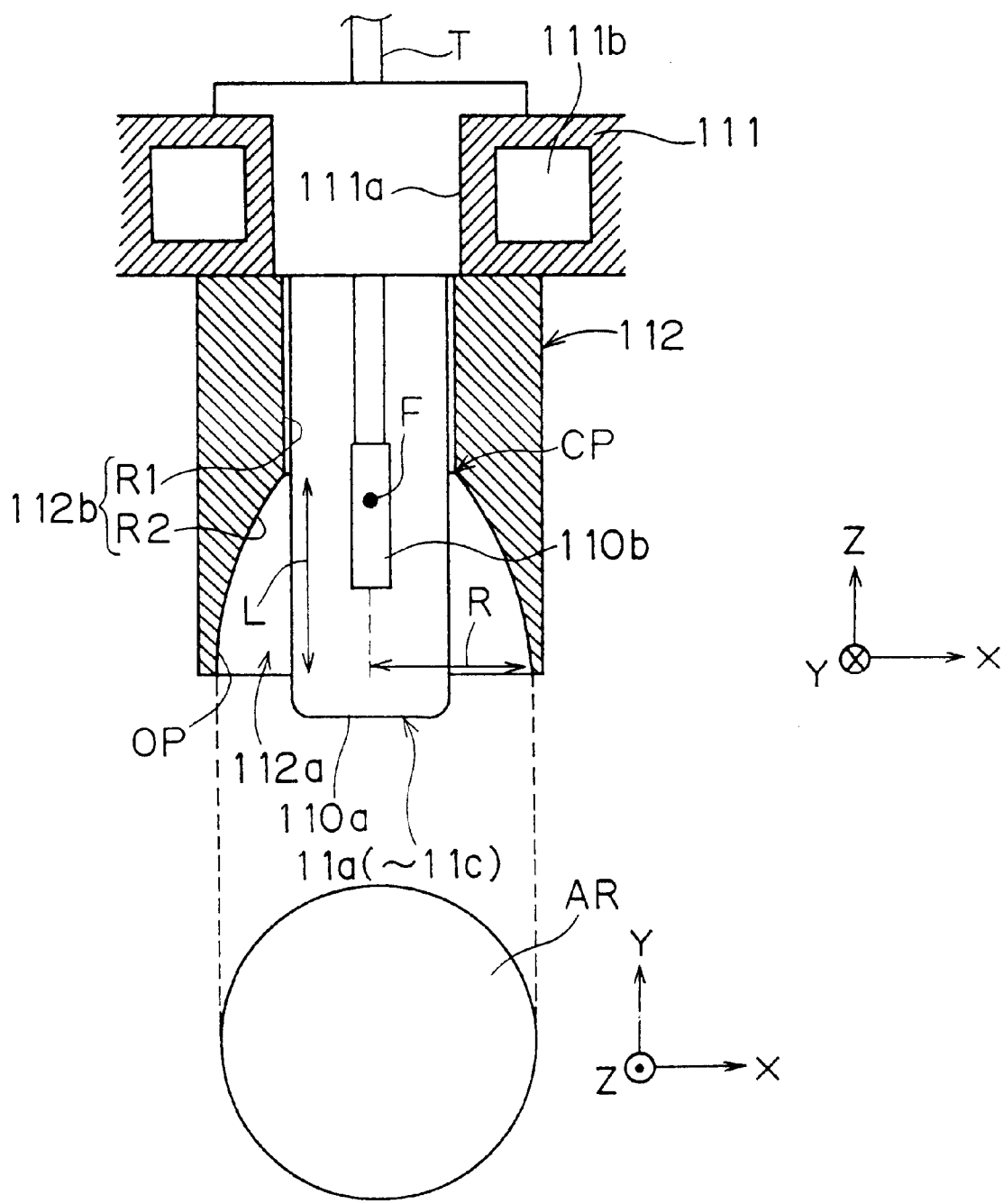
FIG. 3 is an enlarged sectional view of a portion around a lamp of the apparatus shown in FIG. 1.

FIG. 3 is an enlarged sectional view around each of the lamps 11a to 11c. Each reflector 112, having an axisymmetrical shape about the Z-axis, has a cylindrical side surface and is provided with a through hole 112a therein. The inner surface of the through hole 112a defines a gold-plated reflecting surface 112b for efficiently reflecting the light emitted from the lamp 11a, 11b or 11c. The reflecting surface 112b has a cylindrical first reflecting surface R1 on upper and a second reflecting surface R2 connected with the lower end (a connecting portion CP) of the first reflecting surface R1 respectively, and the second reflecting surface R2 has a shape spread toward the substrate W (downward), more specifically an inverted elliptic semispherical surface shape or an inverted parabolic semispherical surface shape.

The reflector is made of aluminum having excellent thermal conductivity, for quickly transmitting received heat to the base plate 111. The lower end of the second reflecting surface R2, i.e., the lower end of the through hole 112a of the reflector 112 defines a circular opening OP having isotropy in the X-Y plane, and this opening OP is opposed to the substrate W held by the substrate holding/rotating part 20. The height of the second reflecting surface R2, i.e., the length L between the connecting portion CP with the first reflecting surface R1 and the lower opening OP is in excess of the radius R of the opening OP.

The central axes of the mounting hole 111a of the base plate 111 and the through hole 112a of the reflector 112 are substantially concentric along the Z-axis direction while the mounting hole 111a and the through hole 112a are substantially identical in diameter to each other. Therefore, the mounting hole 111a and the through hole 112a of the reflector 112 substantially continue with each other thereby defining a single hole. The lamp 11a, 11b or 11c is inserted in and mounted on this hole as described below.

The lamp 11a, 11c or 11c serving as a light source is an infrared halogen lamp having a filament 110b provided in a cylindrical quartz tube 110a so that its longitudinal direction substantially matches with the central axis (Z-axis direction) of the cylinder and a terminal T derived from its upper end for energizing the filament 110b, and the infrared halogen lamp is filled with halogen gas. The filament 110b, which is preferably in the form of a point, is elongated along the central axis of the cylinder due to limitation of required intensity, lamp life, manufacturability and the like.

Figure 4A:
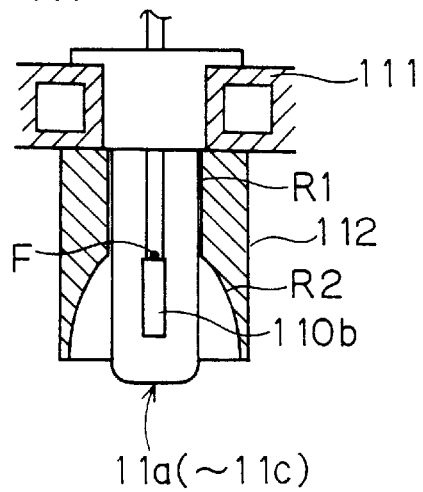
FIGS. 4A to 4E show a filament of the lamp of the apparatus shown in FIG. 1 located on various positions.
Figure 4B:
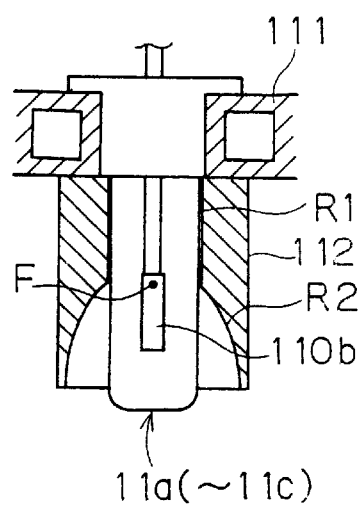
Figure 4C:
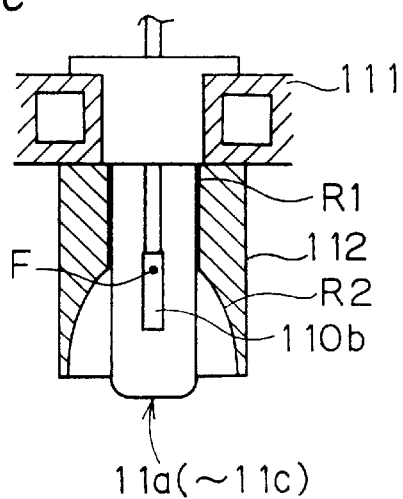
Figure 4D:
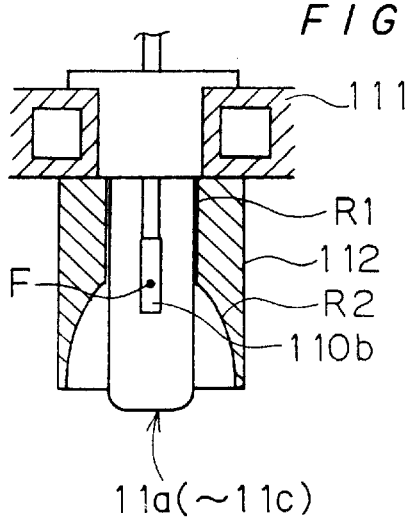
Figure 4E:
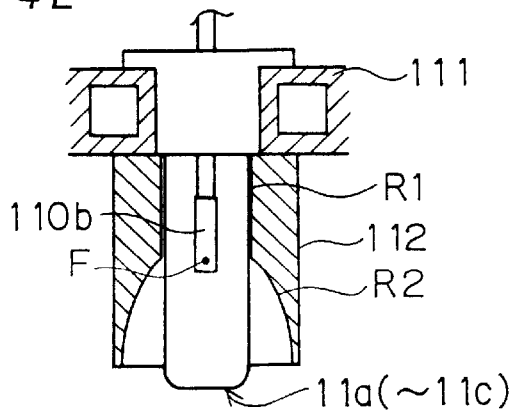

Particularly in the first embodiment, the positional relation between the filament 110b and the first and second reflecting surfaces R1 and R2 of the reflector 112 is set as follows: The lower end of the filament 110b is located in the area between the upper end (the connecting portion with the first reflecting surface R1) of the second reflecting surface R2 and the lower opening OP, more specifically an area closer to the opening OP than the focal point F of the second reflecting surface R2 while the upper end of the filament 110b is located within the area of the first reflecting surface R1. A portion of at least ⅓ from the upper end of the filament 110b is located in an area closer to the first reflecting surface R1 (upper side) from the focal position of the second reflecting surface R2. The reason for this is as follows:

FIGS. 4A to 4E show the filament 110b of the lamp 11a, 11b or 11c located on various positions. FIG. 4A shows the overall filament 110b located under the focal position of the second reflecting surface R2 and FIG. 4B shows the upper end of the filament 110b located slightly above the focal position of the second reflecting surface R2, while FIGS. 4C and 4D show the filament 110b located on higher positions and FIG. 4E shows the lower end of the filament 110b located slightly below the focal position of the second reflecting surface R2. When performing a computer simulation of tracing a single ray per degree between angles 0° and 180° formed by several portions of the filament 110b along the Z-axis direction and the Z-axis direction while locating the filament 110b on various Z-axial positions, the quantity of light, emitted from the filament 110b, reaching a circular area AR (expressing the X-Y plane in parallel with the planes of the figures in FIG. 3) formed by projecting the opening OP on the substrate W was large under the aforementioned conditions of the first embodiment. In other words, the rate (heating efficiency) of the light reaching the area AR was excellent when the lower end of the filament 110b was located in the area between the focal point F of the reflecting surface R2 and the opening OP while the upper end of the filament 110b was located within the area of the first reflecting surface R1, and the rate (heating efficiency) of the light reaching the area AR was most excellent when the portion of at least ⅓ from the upper end of the filament 110b was located in the area closer to the first reflecting surface R1 (upper side) from the position of the focal point F of the second reflecting surface R2. In the apparatus according to this embodiment, therefore, most of the light emitted from the lamp 11a, 11b or 11c can be concentrated to the substantially identical circular area AR formed by projecting the opening OP of the second reflecting surface R2 located under the lamp 11a, 11b or 11c on the surface of the substrate W, to attain excellent heating efficiency.

This apparatus is formed to satisfy the aforementioned conditions, whereby the lower end of the filament 110b is located below the lower end of the first reflecting surface R1 for suppressing the quantity of heat reserved in the reflector 112 as compared with the case of locating the overall filament 110b in the cylinder of the first reflecting surface R1.

In this apparatus, further, the lamps 11a to 11c having the aforementioned directivity are divided into three groups of the lamp 11a, the lamps 11b and the lamps 11c. In other words, the lamp 11a, the lamps 11b and the lamps 11c form three groups provided on positions corresponding to the center area CA, the middle area MA and the edge area EA of the substrate W respectively (see FIG. 2). Thus, the lamps 11a to 11c of the respective groups intensively irradiate the corresponding positions of the substrate W with light for mainly heating these positions respectively.

In correspondence thereto, the radiation thermometers 30a to 30c are also divided into three groups. In other words, the radiation thermometers 30a, 30b and 30c are provided in correspondence to the center area CA, the middle area MA and the edge area EA of the substrate W respectively.

When heating the substrate W, power supplied to the lamps 11a to 11c located on the respective positions is controlled, i.e., feedback-controlled on the basis of the respective temperature signals so that temperatures on the respective positions of the substrate W indicated by the radiation thermometers 30a to 30c are identical to each other in response to a previously programmed heating pattern. The substrate W is rotated and heated as hereinabove described, thereby ensuring temperature uniformity in the X-Y plane of the substrate W.

According to this embodiment, as hereinabove described, the irradiation part 11 has the reflecting surfaces 112b having the cylindrical first reflecting surfaces R1 having symmetry axes in the direction substantially perpendicular to the substrate W and the second reflecting surfaces R2 continuous with the side of the first reflecting surfaces R1 on the sides closer to the substrate W and spread toward the substrate W for reflecting the light emitted from the lamps 11a to 11c, whereby the light emitted toward the substrate W reaches the substrate W as such while the light multiple-reflected in the first reflecting surfaces R1 as well as the light reflected sideward (the direction close to the direction in the X-Y plane) on the lower ends (connecting portions CP) are also reflected and collected downward (toward the substrate W) by the second reflecting surfaces R2, whereby directivity of irradiation toward the substrate W is excellent, heating efficiency for the substrate W is improved an the light can be concentrated in the vicinity of the areas AR on the substrate W corresponding to the lamps 11a to 11c and hence temperature control is simplified in these portions. Further, the quantity of cylindrical portions is relatively small as compared with the case of forming the reflecting surfaces 112b only by cylindrical reflecting surfaces, whereby the quantities of heat reserved in the lamps 11a to 11c and the reflecting surfaces 112b are small and the lives thereof can be elongated.

Further, a first longitudinal end of the filament 110b in each of the lamps 11a to 11c is located in the area between the connecting portion CP and the opening OP to be closer to the substrate W than the focal point F of the second reflecting surface R2 forming an elliptic or parabolic spherical surface while a second longitudinal end of the filament 110b is located closer to the first reflecting surface R1 than the connecting portion CP, whereby directivity and irradiation efficiency can be improved.

In addition, the portion of at least ⅓ along the longitudinal direction of the filament 110b is located in an area closer to the first reflecting surface R1 from the focal position of the second reflecting surfaces R2, whereby directivity and irradiation efficiency can be further improved.

In the irradiation part 11, the plurality of reflectors 112 are mounted on the base plate 111 respectively to substantially render the plurality of mounting holes 111a of the base plate 111 and the through holes 112a of the plurality of reflectors 112 continuous with each other for forming a plurality of continuous holes and the plurality of lamps 11a to 11c are mounted on the plurality of continuous holes respectively thereby holding the plurality of lamps 11a to 11c in a plane substantially parallel to the substrate W held by the substrate holding/rotating part 20, whereby the plurality of lamps 11a to 11c or the plurality of reflectors 112 can be individually exchanged when causing inconvenience, so that the cost can be reduced as compared with the case of exchanging the overall irradiation part 11.

The base plate 111 further has the cooling tubes 111b therein, whereby the reflectors 112 and the lamps 11a to 11c can be inhibited from reserving heat and increased in life.

While examples of the substrate heat treatment apparatus 1 and substrate heat treatment employing the same have been described with reference to the first embodiment, the present invention is not restricted to these. For example, each second reflecting surface R2 forming an elliptic or parabolic semi-spherical surface in the aforementioned first embodiment may alternatively have another shape, such as the shape of a side surface of a truncated cone, spread toward the substrate W.

<Second Embodiment>

FIG. 5 is a longitudinal sectional view of a substrate heat treatment apparatus 1 according to a second embodiment of the present invention. In the substrate heat treatment apparatus 1 according to the second embodiment, the overall structure excluding an irradiation part 11 is identical to that of the first embodiment, and description thereof is omitted.

The irradiation part 11 according to the second embodiment mainly includes a base plate 111 and a plurality of irradiation units LU each consisting of lamps 11a to 11c, a reflector 112 and a position control part 113. The base plate 111 is a discoidal member having a larger diameter than a substrate W, and is horizontally provided above the substrate W in opposition thereto to cover the overall surface of the substrate W held by a substrate holding/rotating part 20. The base plate 111 is provided with a plurality of Z-axis directional cylindrical mounting holes 111a while cooling passages, more specifically cooling tubes 111b feeding cooling water are provided in the base plate 111 between the mounting holes 111a. The cooling tubes 111b can quickly remove heat transmitted from the reflectors 112 described later.

A bottom plan view of the irradiation part 11 is similar to FIG. 2 showing the first embodiment. As shown in FIG. 2, the mounting holes 111a are provided substantially along the overall surface of a portion of the base plate 111 covering the substrate W, and the lamps 11a to 11c are inserted in the mounting holes 111a. Thus, the lamps 11a to 11c are located in a plane (X-Y plane) substantially parallel to the held substrate W.

As shown in FIGS. 5 and 2, the reflectors 112 are provided to enclose the peripheries of the mounting holes 111a of the base plate 111 respectively.

Figure 6A:
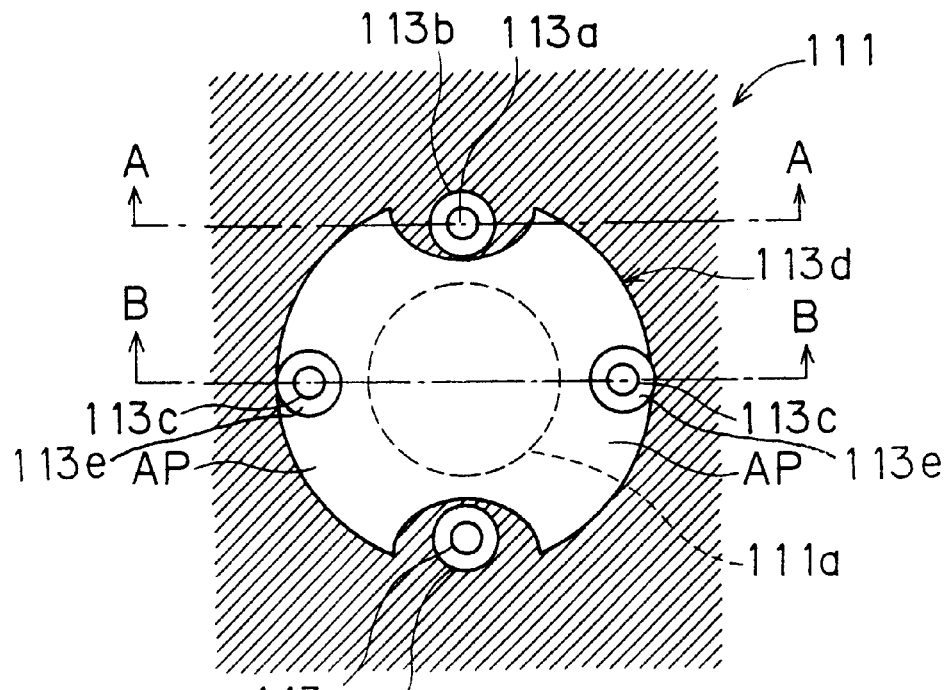
FIG. 6A is a plan view of a portion around a position control part of the apparatus shown in FIG. 5.
Figure 6B:
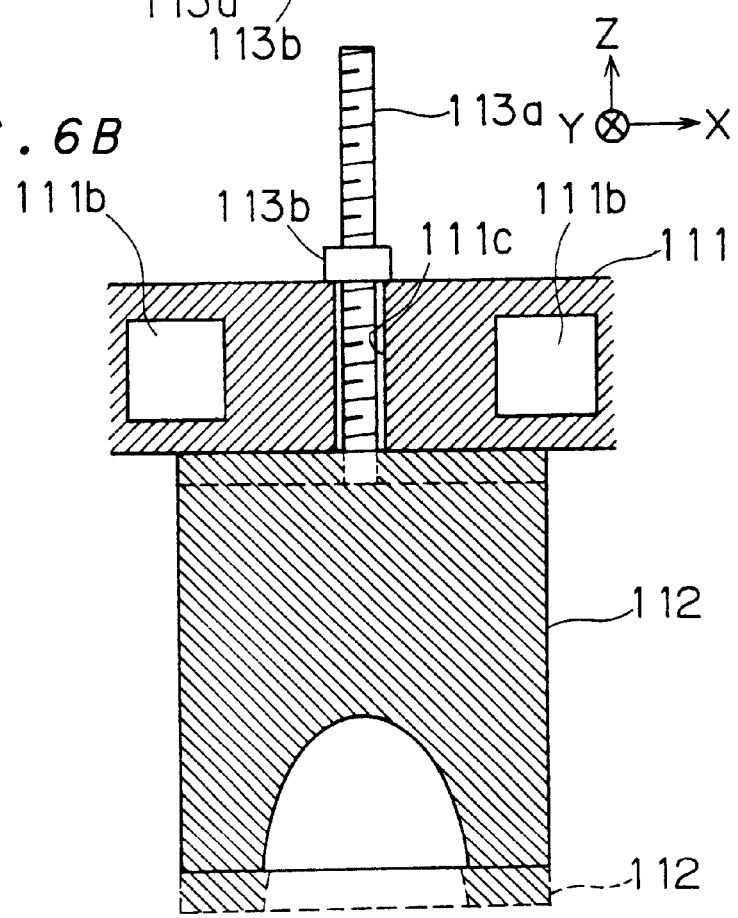
FIG. 6B is a sectional view taken along the line A—A in FIG. 6A.

FIG. 6A is a plan view showing a portion around each position control part 113, and FIG. 6B is a sectional view taken along the line A—A in FIG. 6A. As shown in FIG. 6A, two reflector control bolts 113a are fixed to positions sandwiching a through hole 112a formed on the upper end surface of each reflector 112 described later on the outer side perpendicularly to the upper end surface. Further, two bolt insertion holes 111c are provided on the base plate 111 on positions sandwiching the mounting hole 111a therebetween outside the mounting hole 111a. The aforementioned two reflector control bolts 113a pass through these two bolt insertion holes 111c, and a reflector control nut 113b is mounted on each reflector control bolt 113a for controlling the position of the reflector 112 on the upper side of the base plate 111. The reflector 112 is mounted on the base plate 111 in a suspending state. Due to this structure, the relative distance between the reflector 112 and the base plate 111 can be changed by changing the position for screwing the reflector control nut 113b in the reflector control bolt 113a.

Figure 7:
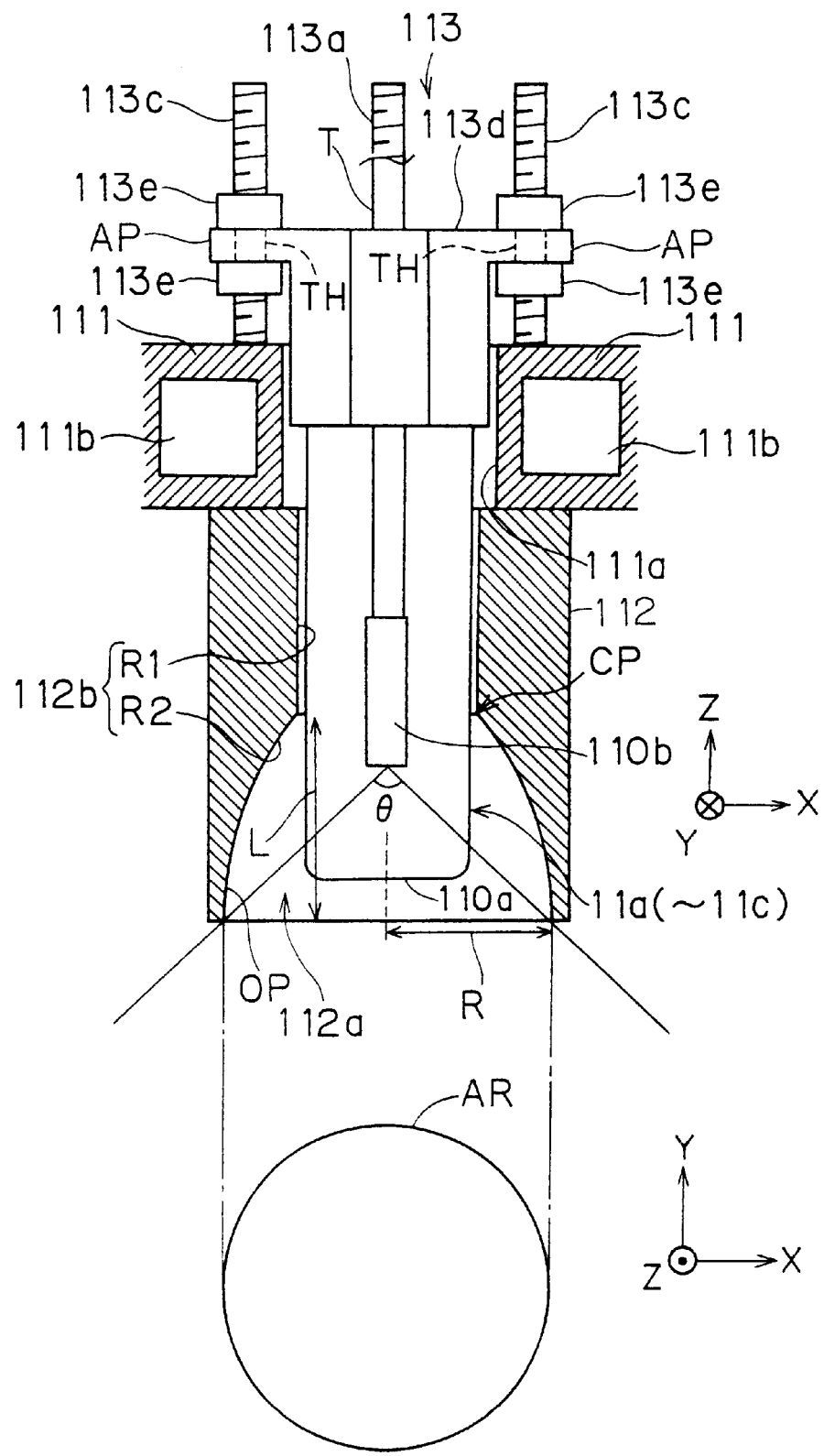
FIG. 7 is a sectional view taken along the line B—B in FIG. 6A along with an area AR located under this portion.

FIG. 7 is a sectional view taken along the line B—B in FIG. 6A along with an area AR located under this portion. Two lamp control bolts 113c are fixed to positions sandwiching the mounting hole 111a therebetween in the vicinity of the outer side of the mounting hole 111a on the upper surface of the base plate 111 substantially perpendicular to the two bolt insertion holes 111c perpendicularly to the surface respectively. A mounting flange 113d is provided on the upper end of each lamp 11a, 11b or 11c inserted in each mounting hole 111a of the base plate 111. The mounting flange 113d has through holes TH in extending portions AP provided on its side surfaces, so that the lamp control bolts 113c pass through the through holes TH. Two lamp control nuts 113e for controlling the position of the lamp 11a, 11b or 11c are mounted on the lamp control bolts 113c respectively to sandwich the mounting flange 113d therebetween. Due to this structure, the lamp 11a, 11b or 11c can be fixed to arbitrary positions of the lamp control bolts 113c by screwing the lower lamp control nuts 113e in arbitrary positions of the lamp control bolts 113c, mounting the mounting flange 113d so that the lamp control bolts 113c pass through the through holes TH and screwing the upper lamp control nuts 113e in the lamp control bolts 113c and fastening the same. Therefore, the relative distance between the lamp 11a, 11b or 11c and the base plate 111 can be changed by changing the positions for screwing the lamp control nuts 113e in the lamp control bolts 113c.

Each reflector 112, having an axisymmetrical shape about the Z-axis, has a cylindrical side surface and is provided with a through hole 112a therein. The inner surface of the through hole 112a defines a gold-plated reflecting surface 112b for efficiently reflecting light emitted from the lamp 11a, 11b or 11c. The reflecting surface 112b has a cylindrical first reflecting surface R1 on upper and a second reflecting surface R2 connected with the lower end (a connecting portion CP) of the first reflecting surface R1 respectively, and the second reflecting surface R2 has a shape spread toward the substrate W (downward), more specifically an inverted elliptic semispherical surface shape or an inverted parabolic semispherical surface shape. Therefore, the second reflecting surface R2 also reflects light multiple-reflected in the cylinder of the first reflecting surface R1 and thereafter reflected sideward on an end closer to the substrate W toward the substrate W and collects the same, whereby the reflector 112 defines a reflecting surface having high directivity for the light emitted from the lamp 11a, 11b or 11c toward the substrate W. In other words, the apparatus according to the second embodiment can also increase the quantity of light reaching the circular area AR (expressing the X-Y plane in parallel with the plane of the figure) formed by projecting an opening OP on the substrate W depending on the positions of the lamp 11a, 11b or 11c and the reflector 112.

The reflector 112 is made of aluminum having excellent thermal conductivity, for quickly transmitting received heat to the base plate 111. The lower end of the second reflecting surface R2, i.e., the lower end of the through hole 112a of the reflector 112 defines the circular opening OP having isotropy in the X-Y plane, and this opening OP is opposed to the substrate W held by the substrate holding/rotating part 20. The height of the second reflecting surface R2, i.e., the length L between the connecting portion CP with the first reflecting surface R1 and the opening OP is in excess of the radius R of the opening OP.

The central axes of the mounting hole 111a of the base plate 111 and the through hole 112a of the reflector 112 are substantially concentric along the Z-axis direction while the mounting hole 111a and the through hole 112a are substantially identical in diameter to each other. Therefore, the mounting hole 111a and the through hole 112a of the reflector 112 substantially continue with each other thereby defining a single hole. The lamp 11a, 11b or 11c is inserted in and mounted on this hole as described below.

The lamp 11a, 11c or 11c serving as a light source is an infrared halogen lamp having a filament 110b provided in a cylindrical quartz tube 110a so that its longitudinal direction substantially matches with the central axis (Z-axis direction) of the cylinder and a terminal T derived from its upper end for energizing the filament 110b, and the infrared halogen lamp is filled with halogen gas. The filament 110b, which is preferably in the form of a point, is elongated along the central axis of the cylinder due to limitation of required intensity, lamp life, manufacturability and the like.

In this apparatus, the aforementioned lamps 11a to 11c are divided into three groups of the lamp 11a, the lamps 11b and the lamps 11c. In other words, the lamp 11a, the lamps 11b and the lamps 11c form three groups provided on positions corresponding to a center area CA, a middle area MA and an edge area EA of the substrate W respectively (see FIGS. 5 and 2). Thus, the lamps 11a to 11c of the respective groups intensively irradiate the corresponding positions of the substrate W with light for mainly heating these positions respectively.

In correspondence thereto, radiation thermometers 30a to 30c are also divided into three groups. In other words, the radiation thermometers 30a, 30b and 30c are provided in correspondence to the center area CA, the middle area MA and the edge area EA of the substrate W respectively.

When heating the substrate W, power supplied to the lamps 11a to 11c is controlled, i.e., feedback-controlled on the basis of respective temperature signals so that temperatures on the respective positions of the substrate W indicated by the radiation thermometers 30a to 30c are identical to each other in response to a previously programmed heating pattern.

No radiation thermometers are provided on intermediate portions between the center area CA, the middle area MA and the edge area EA of the aforementioned substrate W. Therefore, these intermediate portions cannot be temperature-controlled in real time. In the apparatus according to the second embodiment, doses on the intermediate portions can be previously controlled by controlling the positions of the lamps 11a to 11c and the reflectors 112 by the position control part 113.

The relative positions of the lamps 11a to 11c and the reflectors 112 with respect to the base plate 111 can be controlled respectively as hereinabove described and the reflectors 112 have the aforementioned shape, whereby relative positional relation between the lamps 11a to 11c and the first and second reflecting surfaces R1 and R2 of the reflectors 112 as well as the distances between these and the substrate W can be changed by changing the positions of at least either the lamps 11a to 11c or the reflectors 112.

It is obvious that at least an irradiation angle θ (see FIG. 7) of direct light with respect to the surface of the substrate W changes when changing the relative positions of the reflectors 112 and the lamps 11a to 11c. It is also obvious that the intensity of the light, inversely proportional to the square of the distance, also changes when the distances between the lamps 11a to 11c and the substrate W change. Therefore, not only the intensity of the light emitted from the lamps 11a to 11c toward the areas AR but also the intensity to the peripheries thereof (intermediate portions of between the areas) can be changed and the ratio of the intensity levels can be varied by changing these positions.

FIGS. 8A to 8E show the lamp 11a, 11b or 11c located on various positions. FIG. 8A shows the overall filament 110b of the lamp 11a, 11b or 11c located under the focal position of the second reflecting surface R2 and FIG. 8B shows the upper end of the filament 110b located slightly above the position of the focal point F of the second reflecting surface R2, while FIGS. 8C and 8D show the lamp 11a, 11b or 11c located on higher positions and FIG. 8E shows the lower end of the filament 110b located slightly below the position of the focal point F of the second reflecting surface R2. A computer simulation of tracing a single ray per degree between angles 0° and 360° formed by several portions of the filament 110b along the Z-axis direction and the Z-axis direction was performed while locating the lamp 11a, 11b or 11c on various Z-axial positions. The quantity of rays, emitted from the filament 110b, reaching the circular area AR formed by projecting the opening OP on the substrate W and the quantity of rays reaching its periphery were obtained, to prove that the quantity of rays reaching the area AR, the quantity of rays reaching its periphery and the ratio of the quantities of the both rays vary with the positions of the lamps 11a to 11c.

As a tendency, such a result that the quantity of emission into the area AR is reduced and the quantity of application to its periphery is increased as the irradiation angle θ is increased, i.e., the position of the lamp 11a, 11b or 11c is lowered (in order from FIG. 8A to FIG. 8E) with respect to the reflector 112.

While only the position of the lamp 11a, 11b or 11c was changed in the above simulation, a tendency similar to the above is recognized also when changing the Z-axial position of the reflector 112 or the positions of both of the lamp 11a, 11b or 11c and the reflector 112 due to the relative positions thereof along the Z-axis direction.

In the apparatus according to this embodiment, the mounting positions of at least either the lamps 11a to 11c or the reflectors 112 are controlled along the Z-axis direction for adjusting the quantities of light reaching the intermediate portions between the center area CA, the middle area MA and the edge area EA. Thus, temperature uniformity in the X-Y plane of the substrate W is ensured by rotating and heating the substrate W.

As hereinabove described, the apparatus according to this embodiment comprises the position control part 113 capable of controlling the distances between the lamps 11a to 11c and the substrate W, whereby the quantities of light applied to the intermediate portions between the center area CA, the middle area MA and the edge area EA ca be adjusted by controlling the distances between the lamps 11a to 11c or the reflectors 112 and the substrate W, and hence temperature uniformity of the substrate W can be improved and high-quality heat treatment can be performed.

The distances between the lamps 11a to 11c and the substrate W can be individually controlled as to the respective ones of the plurality of irradiation units LU by comprising the plurality of irradiation units LU consisting of the lamps 11a to 11c and the position control parts 113 and individually operating the respective position control parts 113, whereby the temperature uniformity of the substrate W can be further improved for performing higher quality heat treatment by controlling the distances between the lamps 11a to 11c or the reflectors 112 and the substrate W in the respective ones of the center area CA, the middle area MA and the edge area EA to be different.

Further, each reflector 112 has the cylindrical first reflecting surface R1 having a symmetry axis in the direction substantially perpendicular to the substrate W and the second reflecting surface R2 connected on the end of the first reflecting surface R1 closer to the substrate W and spread toward the substrate W, whereby the second reflecting surface R2 also reflects light multiple-reflected in the cylinder of the first reflecting surface R1 and thereafter reflected sideward on the side of the substrate W and collects the same, whereby directivity of irradiation toward the substrate W can be further improved.

While examples of the substrate heat treatment apparatus 1 and substrate heat treatment employing the same have been described with reference to the second embodiment, the present invention is not restricted to these. For example, the second reflecting surface R2 forming an elliptic or parabolic semi-spherical surface may alternatively have another shape such as the shape of a side surface of a truncated cone spread toward the substrate W, similarly to the first embodiment.

<Third Embodiment>

FIG. 9 is a side sectional view showing the overall structure of a heat treatment apparatus according to a third embodiment of the present invention. The heat treatment apparatus shown in FIG. 9 is the so-called lamp annealing apparatus rapidly heat-treating a substrate W by irradiating the same with light. This heat treatment apparatus roughly comprises an upper lamp house 71 and a lower furnace wall 12.

The lamp house 71 is provided with 19 lamps 82 and 19 reflectors 76. Each reflector 76 is provided therein with a lamp insertion hole concentrically with its central axis, so that each lamp 82 is inserted into the hole from above. Each lamp 82 is formed by a cylindrical infrared halogen lamp consisting of a cylindrical quartz tube filled with halogen gas provided with a cylindrical filament 73 in the vicinity of its central axis due to limitation of required intensity, lamp life, manufacturability and the like. The filament 73 is so arranged that its longitudinal direction is along the central axis of the quartz tube. A filament deriving terminal 74 for supplying power to the filament 73 is provided on the upper portion of each lamp 82. While the lamps 82 are arranged in the form of a plane in this embodiment, the mode of this plane arrangement is further described later.

Each reflector 76 is a reflecting mirror having an elliptic spherical surface shape reflecting light emitted from the lamp 82 downward (toward the substrate W).

The upper ends of the reflectors 76 are fixed to the lower surface of a base plate 78 provided on the upper portion of the lamp house 71. Each lamp 82 is fixed to the base plate 78 through a mounting flange 75 to be concentric with the central axis of each reflector 76. The base plate 78 is provided therein with a plurality of water-cooling paths 77 to be capable of cooling heat transmitted from the lamps 82.

The furnace wall 12 is formed therein with a treatment chamber PR for heat treating the substrate W. A throat 18 for introducing/discharging the substrate W is formed on the furnace wall 12, while a shutter 19 is provided outside the throat 18. The shutter 19 is openable/closable by a switching mechanism (not shown). When the shutter 19 is open, an untreated substrate W can be introduced into the treatment chamber PR from the throat 18 and a treated substrate W can be discharged from the treatment chamber PR. When the shutter 19 is closed (the state shown in FIG. 9), it follows that the treatment chamber PR is sealed with the shutter 19 and a chamber window 23 described later through an O-ring (not shown), to define a closed space.

A support 24 for supporting the substrate W in the treatment chamber PR is rotatably provided in the furnace wall 12. The support 24 is a transparent member of quartz capable of transmitting light. A magnet 25 is fixed to the lower portion of the support 24. A magnet ring 26 is provided on an outer lower portion of the furnace wall 12 opposed to the magnet 25. The magnet ring 26 fits with a motor shaft of a motor 27, and rotates following rotation of the motor 27. The magnet ring 26 and the magnet 25 mutually apply attractive magneic force so that the support 24 provided with the magnet 25 also rotates upon rotation of the magnet ring 26. When the support 24 rotates, the substrate W supported by the same also rotates about a rotation axis XW. In other words, the motor 27 corresponds to rotation means capable of rotating the support 24 and the substrate W supported by the same about the rotation axis XW. The substrate W is rotated in a plane parallel to the plane formed by the arrangement of the 19 lamps 82, and the rotation axis XW matches with a central axis perpendicularly passing through the center of the substrate W.

The chamber window 23 is provided in the furnace wall 12 above the treatment chamber PR. The chamber window 23 of quartz can transmit the light emitted from the lamps 82 downward, and has a function of sealing the treatment chamber PR.

The furnace wall 12 is further provided with a gas inlet port 28 and a discharge port 29. The gas inlet port 28 and the discharge port 29 are connected with a gas supply line (not shown) and a discharge line (not shown) respectively. Thus, process gas such as nitrogen gas or oxygen gas can be supplied into the treatment chamber PR from the gas inlet port 28 while atmospheric gas in the treatment chamber PR can be discharged from the discharge port 29.

Further, radiation thermometers 30a, 30b and 30c are provided on the outer bottom portion of the furnace wall 12. As hereinabove described, the support 24 is transparent and can transmit infrared light emitted from the heated substrate W. It follows that the infrared light transmitted through the support 24 passes through an inspection window 31 provided on the bottom portion of the furnace wall 12 and reaches the radiation thermometers 30a, 30 and 30c. The radiation thermometers 30a, 30b and 30c, capable of non-contact temperature measurement in a wavelength region transmitted through quartz, measure the temperatures of the substrate W subjected to heat treatment.

The procedure of the treatment in the heat treatment apparatus shown in FIG. 9 having the aforementioned structure is now schematically described. First, discharge is performed through the discharge pot 29 while inert gas (e.g., nitrogen gas) is supplied from the gas inlet port 28 into the treatment chamber PR, for replacing the inner atmosphere of the treatment chamber PR with an atmosphere of the inert gas. The shutter 19 is opened for introducing the untreated substrate W from the throat 18 and placing the same on the support 24. Then, the shutter 19 is closed to block the throat 18 while introducing prescribed process gas from the gas inlet port 28 for replacing the periphery of the substrate W in the treatment chamber PR with an atmosphere of the process gas.

Thereafter power supply to the lamps 82 is started for emitting light from the lamps 82. The light emitted from the lamps 82 is transmitted through the chamber window 23 to reach the substrate W, and rapidly heats the substrate W. When emitting the light from the lamps 82, the substrate W is rotated with the motor 27. In irradiation, further, the substrate W is rotated while the radiation thermometers 30a, 30b and 30c measure temperatures at the central portion, an edge portion and a middle portion between the central and edge portions of the substrate W respectively for controlling the quantity of power supplied to the 19 lamps 82 with a control part (not shown) on the basis of the results of temperature measurement on the respective portions. More specifically, a larger quantity of light must be applied as approaching the edge portion of the substrate W having high thermal dissipation, and hence high power is supplied to the lamps 82 corresponding to the edge of the substrate W while relatively small power is supplied to the lamp 82 corresponding to the central portion of the substrate W.

When a prescribed time elapses to end the heat treatment of the substrate W, emission from the lamps 82 is stopped. Then, nitrogen gas is supplied from the gas inlet port 28 into the treatment chamber PR. Finally, the shutter 19 is opened to open the throat 18 for discharging the treated substrate W from the apparatus, thereby completing the series of heat treatment.

Figure 18:
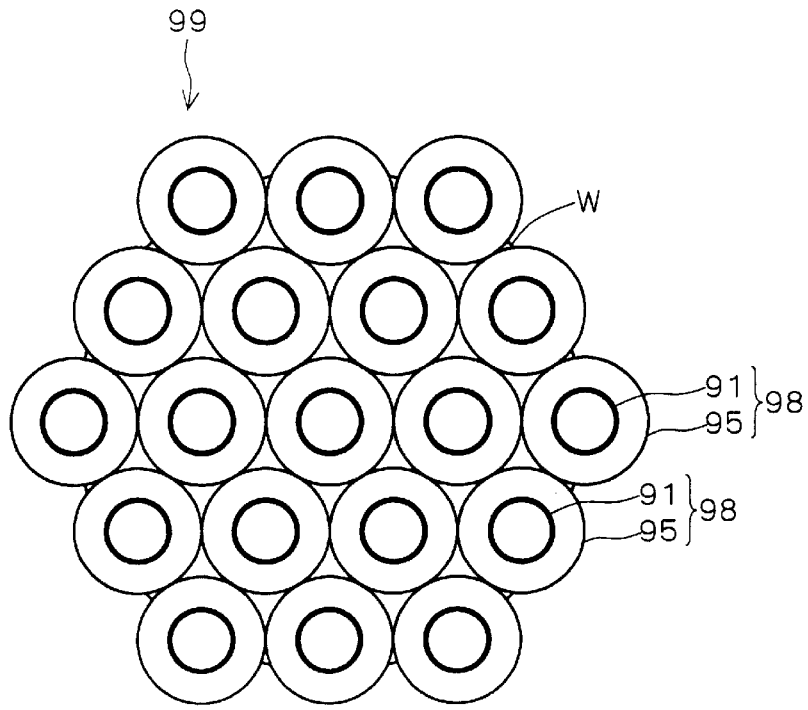
FIG. 18 is a plan view showing lamp arrangement in the conventional RTP apparatus.

The plane arrangement of the 19 lamps 82 in the aforementioned heat treatment apparatus is now described. FIG. 10 is a plan view showing the plane arrangement of the lamps 82 in the heat treatment apparatus according to this embodiment. As shown in FIG. 10, the plane arrangement of the lamps 82 in the heat treatment apparatus according to this embodiment itself is identical to the conventional honeycomb lamp arrangement (see FIG. 18). In other words, six lamp units 80 are adjacently provided around a single lamp unit 80 (coupling of the lamp 82 and the reflector 76). The 19 lamps 82 are arranged in the honeycomb shape shown in FIG. 10 to form a lamp group 81. According to this embodiment, the diameter of the substrate W is 200 mm, and the distance between the centers of most approximate lamps 82 is 50 mm.

The lamp group 81 can be divided into a center area formed by a single lamp 82a located at the center, an edge area formed by 12 lamps 82c located outermost and a middle area formed by six lamps 82b located therebetween. In the third embodiment, the lamps are described as "lamps 82" when comprehensively expressed simply as lamps while described as "lamp(s) 82a (82b or 82c)" when expressed as the lamp(s) belonging to any of the aforementioned areas.

In the heat treatment apparatus according to this embodiment, the plane arrangement of the lamps 82 itself is identical to the conventional honeycomb lamp arrangement, while the symmetry axis XR of the lamp group 81 and the rotation axis XW of the substrate W are displaced by a distance d along a direction parallel to the arrangement plane of the lamp group 81, i.e., the surface of revolution of the substrate W.

The rotation axis XW of the substrate W is an axis passing through the center about which the substrate W is rotated by the motor 27 and perpendicular to the surface of revolution. The symmetry axis XR of the lamp group 81 is an axis forming the center of symmetry of the lamp group 81 and perpendicular to the plane formed by the lamp group 81.

The symmetry of the lamp group 81 is now described. In general, a geometric figure or an object invariant in relation to rotation about a certain axis at an angle $2\pi/n$ (n: natural number of at least 2) has n-fold rotation symmetry. FIGS. 13A to 13D show simple figures having n-fold rotation symmetry.

Figure 13A:
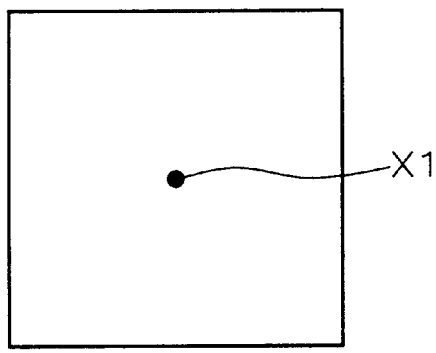
FIGS. 13A to 13D illustrate figures having n-fold rotation symmetry.

The figure shown in FIG. 13A is a square which is invariant in relation to rotation about a symmetry axis X1 at an angle $2\pi/4$ (=90°), i.e., matches with the original figure when rotated by $2\pi/4$ about the symmetry axis X1. Such a square has 4-fold rotation symmetry about the symmetry axis X1.

Figure 13B:
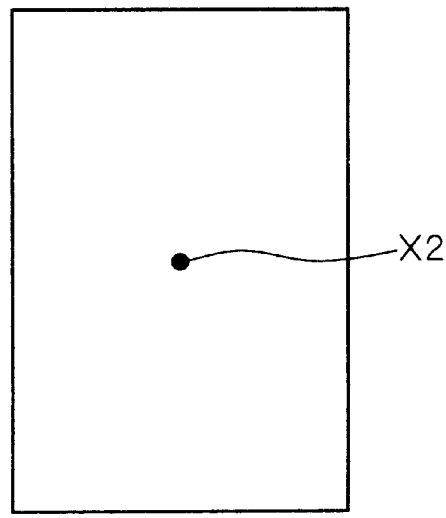

The figure shown in FIG. 13B is a rectangle which is invariant in relation to rotation about a symmetry axis X2 at an angle $2\pi/2$ (=180°), i.e., matches with the original figure when rotated by $2\pi/2$ about the symmetry axis X2. Such a rectangle has 2-fold rotation symmetry about the symmetry axis X2.

Figure 13C:
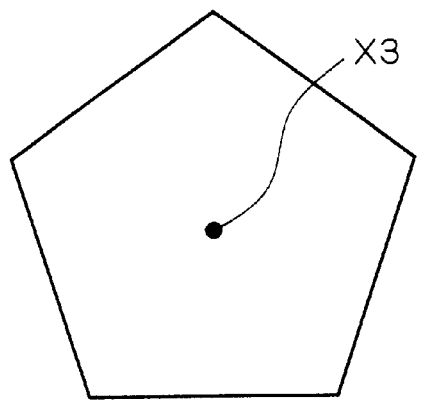

The figure shown in FIG. 13C is an equilateral pentagon which is invariant in relation to rotation about a symmetry axis X3 at an angle $2\pi/5$ (=72°), i.e., matches with the original figure when rotated by $2\pi/5$ about the symmetry axis X3. Such an equilateral pentagon has 5-fold rotation symmetry about the symmetry axis X3.

Figure 13D:
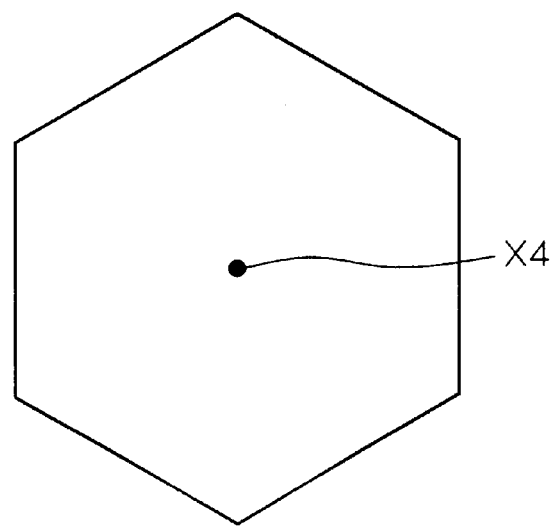

The figure shown in FIG. 13D is an equilateral hexagon which is invariant in relation to rotation about a symmetry axis X4 at an angle $2\pi/6$ (=60°), i.e., matches with the original figure when rotated by $2\pi/6$ about the symmetry axis X4. Such an equilateral hexagon has 6-fold rotation symmetry about the symmetry axis X4. All of the symmetry axes X1 to X4 are perpendicular to the plane of the figures.

Referring again to FIG. 10, the lamp group 81 according to this embodiment has 6-fold rotation symmetry about the symmetry axis XR, as obvious from the above description and FIG. 10. In other words, the lamp group 81 is invariant in relation to rotation about the symmetry axis XR at the angle 2π/6 (=60°). According to this embodiment, the symmetry axis XR of the lamp group 81 and the rotation axis XW of the substrate W are displaced by the distance d along the direction parallel to the arrangement plane of the lamp group 81. The symmetry axis XR of the lamp group 81 is parallel to the rotation axis XW of the substrate W.

Figure 11:
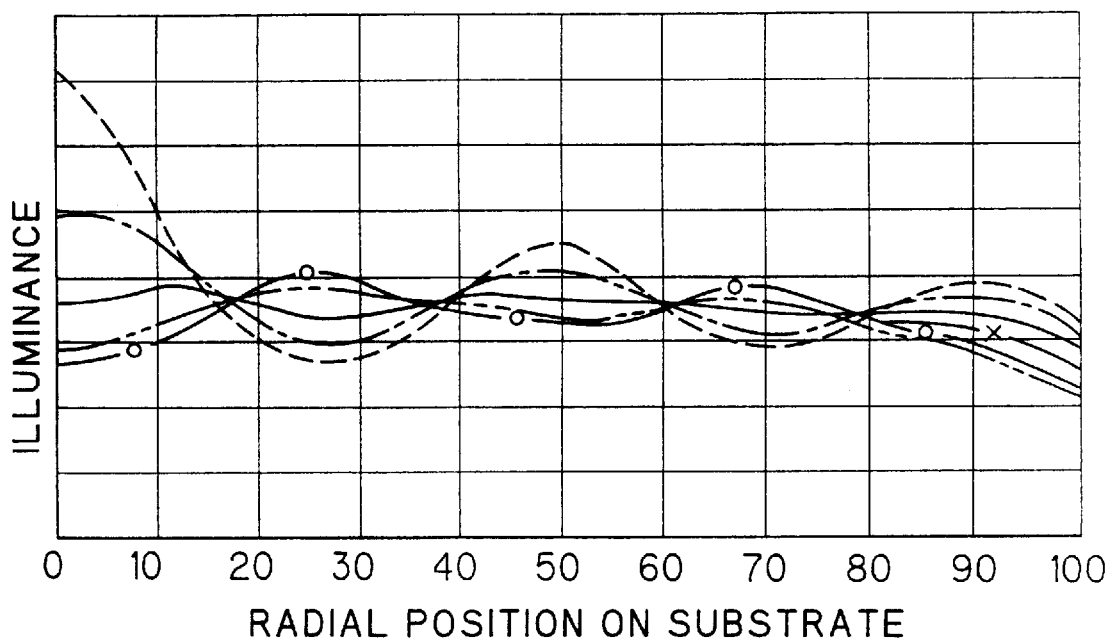
FIG. 11 illustrates radial illuminance distribution on a substrate in the heat treatment apparatus shown in FIG. 9.
Figure 19:
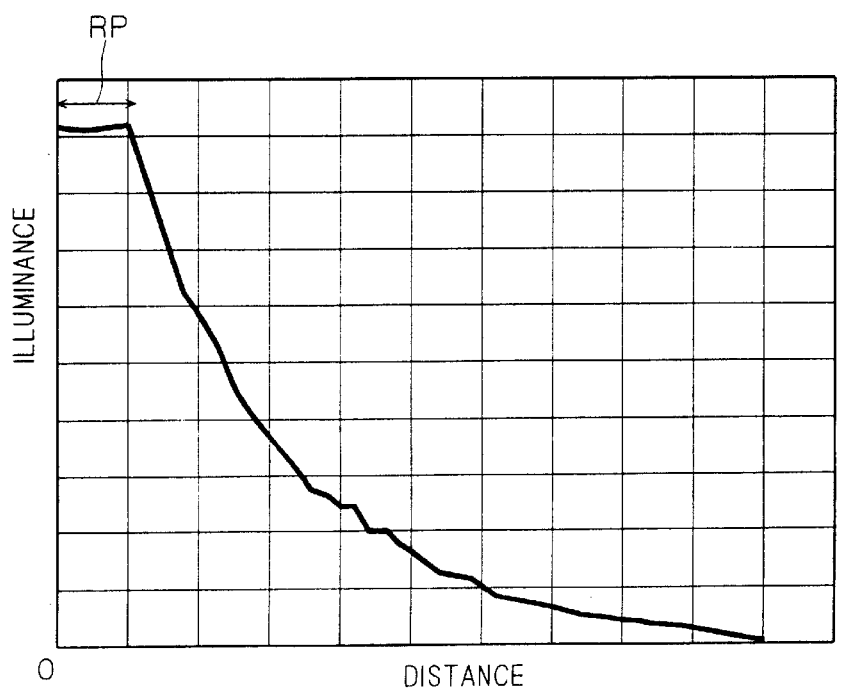
FIG. 19 illustrates illuminance distribution on a substrate with a single lamp.

When the symmetry axis XR and the rotation axis XW are displaced by the prescribed distance d as described above, illuminance distribution on the substrate W changes. FIG. 11 shows radial illuminance distribution on the substrate W in the heat treatment apparatus according to this embodiment. The conventional heat treatment apparatus can be grasped as that matching the symmetry axis XR and the rotation axis XW with each other, i.e., setting the distance d to 0 mm. Illuminance distribution on the substrate W with a single lamp 82 is similar to that of the prior art shown in FIG. 19.

Comparing the illuminance distribution shown in FIG. 11 with that in the conventional heat treatment apparatus shown in FIG. 20, such a tendency is recognized that fluctuation of radial illuminance distribution on the substrate W is reduced by displacing the symmetry axis XR of the lamp group 81 and the rotation axis XW of the substrate W, and fluctuation of the radial illuminance distribution is remarkably reduced as compared with the prior art particularly when the distance d exceeds 10 mm. In other words, uniformity of radial illuminance distribution on the substrate W is improved.

Figure 12:
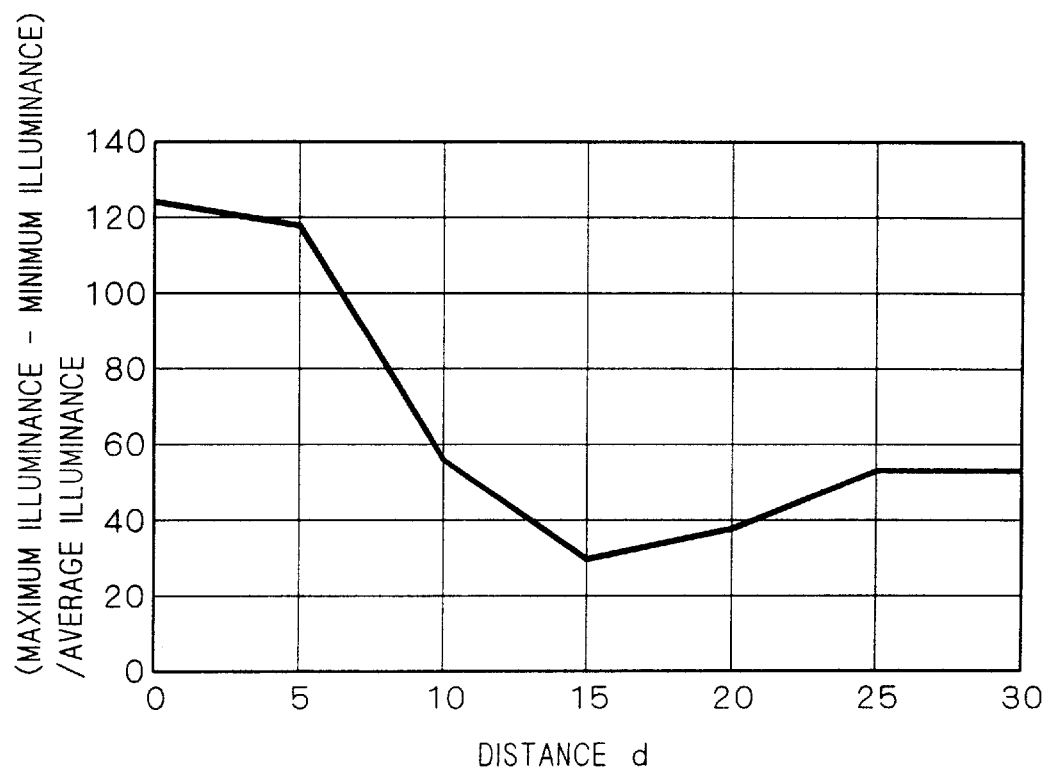
FIG. 12 illustrates the ratio of difference between maximum illuminance and minimum illuminance to average illuminance per distance d shown in FIG. 11.

FIG. 12 illustrates the ratio of difference between maximum illuminance and minimum illuminance to average illuminance per distance d shown in FIG. 11. In other words, this figure illustrates the ratio of the difference between the maximum illuminance and the minimum illuminance at any radial position to the total average illuminance along radial positions (0 mm to 100 mm) on the substrate W as to a certain distance d shown in FIG. 11, for quantitatively showing the magnitude of fluctuation of radial illuminance distribution. Referring to FIG. 12, the value on the left end at the distance d of 0 mm is the conventional ratio.

As clearly understood from FIG. 12, the aforementioned ratio is reduced below the conventional value (d=0 mm) by displacing the symmetry axis XR of the lamp group 81 and the rotation axis XW of the substrate W. It is understood that the ratio is remarkably reduced as compared with the prior art and uniformity of radial illuminance distribution on the substrate W is remarkably improved particularly when the distance d exceeds 10 mm.

The reason why uniformity of illuminance distribution is improved by displacing the symmetry axis XR of the lamp group 81 and the rotation axis XW of the substrate W as described above is now described. The lamp group 81 (see FIG. 10) of the heat treatment apparatus according to this embodiment has 6-fold rotation symmetry, and the 19 lamps 82 are arranged to have regularity about the symmetry axis XR. Such arrangement having regularity itself is absolutely similar as to the lamp group 99 (see FIG. 18) in the conventional heat treatment apparatus.

In the prior art, however, the symmetry axis XR of the lamp group 81 and the rotation axis XW of the substrate W match with each other (distance d=0 m) and hence it follows that a portion of the substrate W passing through a portion immediately under the lamps 82b of the lamp group 81 belonging to the middle area regularly passes through a portion immediately under the lamps 82b belonging to the middle area, for example, also when rotating the substrate W. In other words, the substrate W is rotated to maintain the regularity of the lamp group 81 arranged to have the regularity, and hence peak and bottom portions of the illuminance distribution resulting from the regularity of arrangement of the lamp group 81 are not eliminated by rotation of the substrate W but remain as such. Consequently, radial illuminance distribution remarkably fluctuates on the substrate W in the prior art.

According to the third embodiment, on the other hand, the symmetry axis XR of the lamp group 81 and the rotation axis XW of the substrate W are displaced and hence it is impossible that a portion of the substrate W passing through the portion immediately under the lamps 82b of the lamp group 81 belonging to the middle area regularly passes through the portion immediately under the lamps 82b belonging to the middle area, for example, when rotating the substrate W. In other words, the substrate W is eccentrically rotated with respect to the lamp group 81 arranged to have regularity to break the regularity of the lamp group 81 in a sense, for relaxing peak and bottom portions of illuminance distribution resulting from the regularity of arrangement of the lamp group 81 by rotation of the substrate W. Consequently, fluctuation of radial illuminance distribution on the substrate W is reduced to improve uniformity in the third embodiment. When uniformity of radial illuminance distribution on the substrate W is improved, temperature uniformity of the substrate W in heat treatment can be ensured.

In particular, uniformity of radial illuminance distribution on the substrate W is remarkably improved by setting the distance d for displacing the symmetry axis XR of the lamp group 81 and the rotation axis XW of the substrate W to at least ⅕ and not more than ½ (at least 10 mm and not more than 25 mm) of the arrangement interval (the distance (50 mm) between the centers of most approximate lamps in this embodiment) of the plurality of lamps 82. When the distance d is less than ⅕ of the arrangement interval for the lamps 82, the quantity of displacement is so small that the degree of eliminating peak and bottom portions of illuminance distribution resulting from the regularity of arrangement of the lamp group 81 by rotation of the substrate W is low. When the distance d is greater than ½ of the arrangement interval for the lamps 82, the quantity of displacement is so large that it follows that portions not irradiated with the light emitted from the lamp group 81 are intermittently caused on the edge portion of the substrate W.

Figure 14:
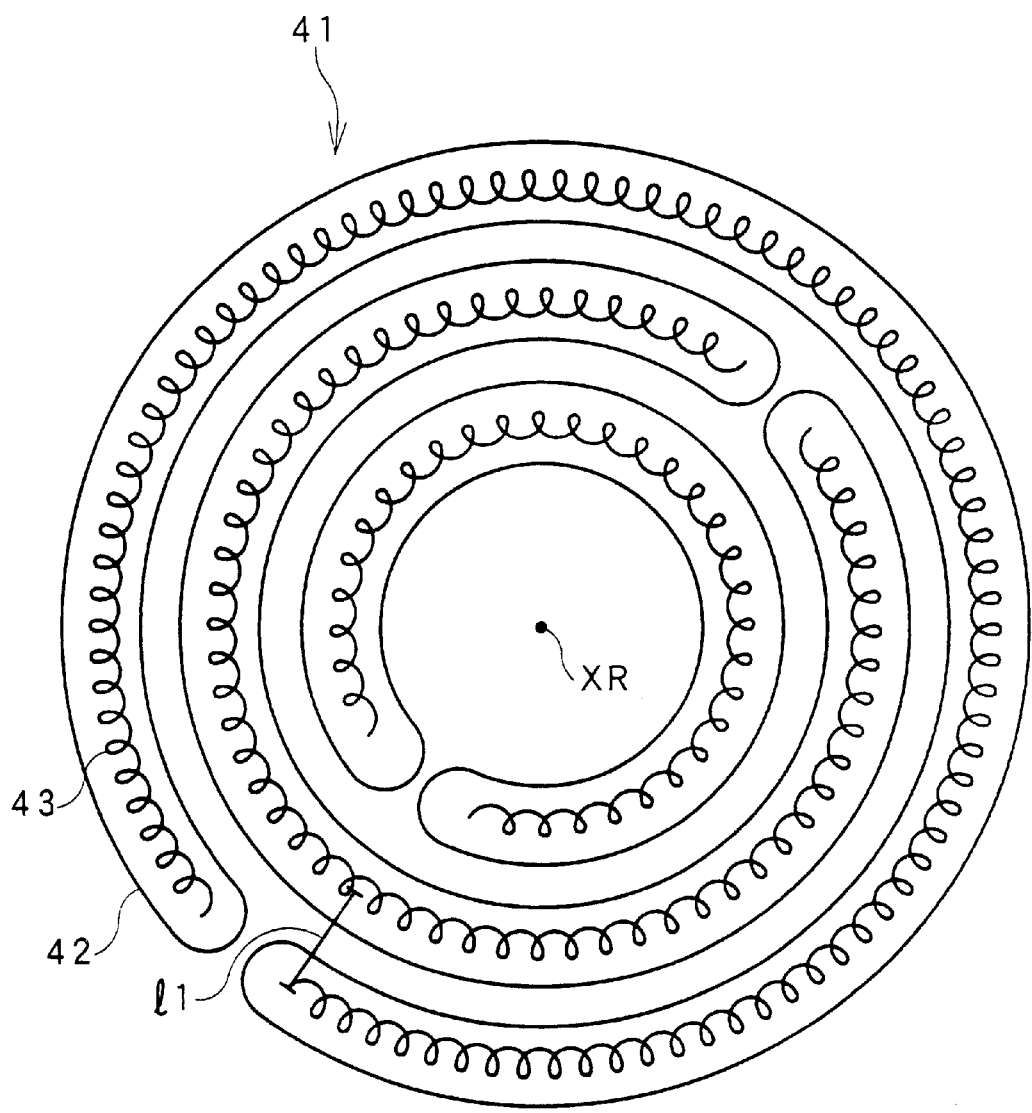
FIG. 14 is a plan view showing another lamp arrangement in the heat treatment apparatus according to the present invention.

While the third embodiment has been described, the present invention is not restricted to the aforementioned example. While the lamps 82 are arranged in the form of a honeycomb to form the lamp group 81 in the aforementioned third embodiment, for example, the lamp arrangement in the lamp group 81 is not restricted to the honeycomb shape but may be in any of the following modes:

FIG. 14 shows a lamp group 41 formed by arranging a plurality of circle lamps 42 having circular filaments 43 on concentric circles. It can be said that this lamp group 41 substantially has n-fold rotation symmetry (n can take an arbitrary natural number of at least 2) about a symmetry axis XR.

Also with such a lamp group 41, it follows that uniformity of radial illuminance distribution on the substrate W is improved and temperature uniformity of the substrate W in heat treatment can be ensured for a reason similar to that described above with reference to the above embodiment when displacing the symmetry axis XR of the lamp group 41 and the rotation axis XW of the substrate W. Referring to FIG. 14, the arrangement interval for the circle lamps 42 indicates the distance between the center lines of the most approximate circle lamps 42 (distance denoted by reference numeral 11 in FIG. 14).

Figure 15:
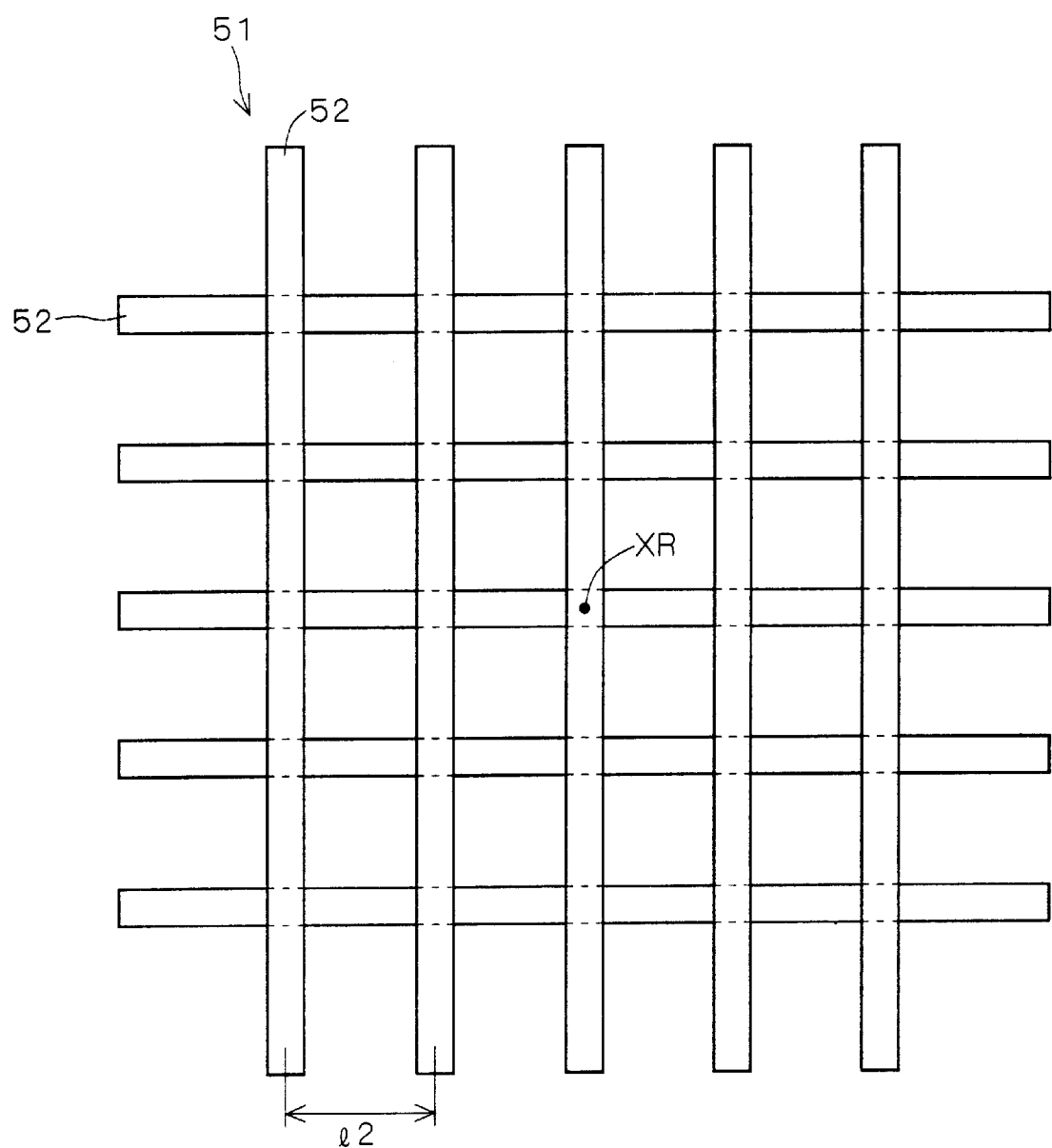
FIG. 15 is a plan view showing still another lamp arrangement in the heat treatment apparatus according to the present invention.

FIG. 15 shows a lamp group 51 formed by arranging a plurality of rod lamps 52 in the form of a lattice. This lamp group 51 has 4-fold rotation symmetry about a symmetry axis XR. Also with such a lamp group 51, it follows that uniformity of radial illuminance distribution on the substrate W is improved and temperature uniformity of the substrate W in heat treatment can be ensured for a reason similar to that described above with reference to the above embodiment when displacing the symmetry axis XR of the lamp group 51 and the rotation axis XW of the substrate W. Referring to FIG. 15, the arrangement interval for the rod lamps 52 indicates the distance between the center lines of rod lamps 52 approximate in parallel with each other (distance denoted by reference numeral 12 in FIG. 15).

Figure 16:
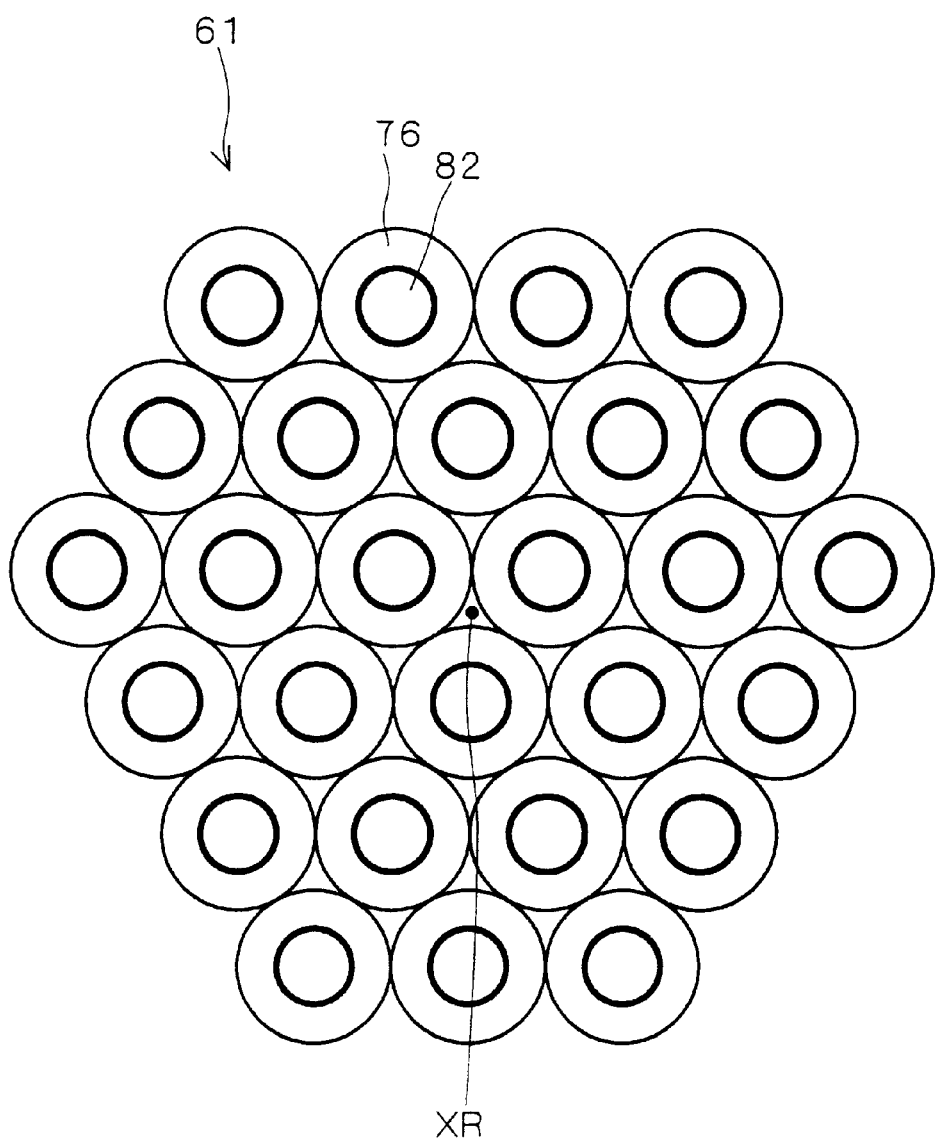
FIG. 16 is a plan view showing a further lamp arrangement in the heat treatment apparatus according to the present invention.
Figure 17:
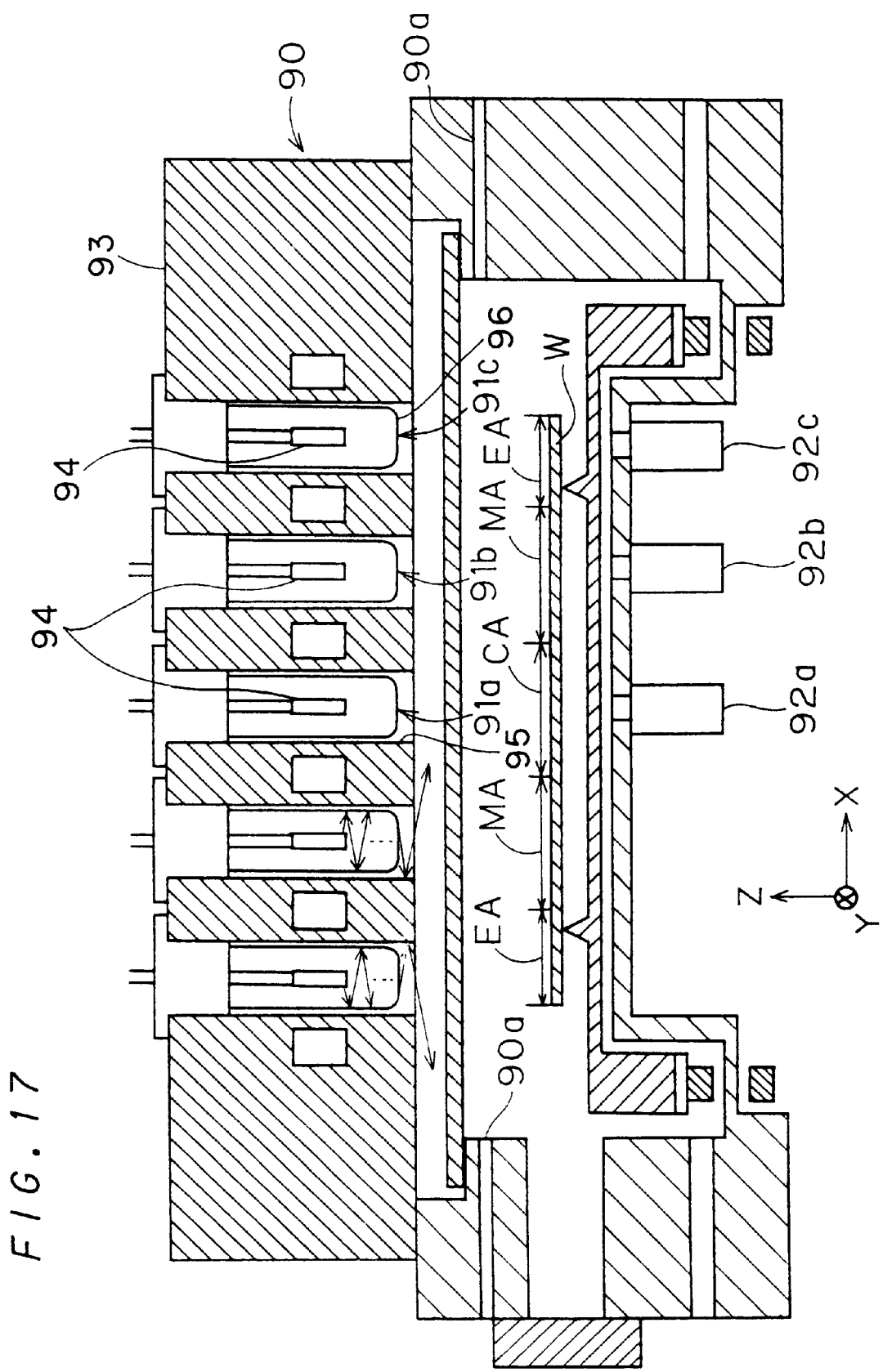
FIG. 17 is a longitudinal sectional view of a conventional RTP apparatus.

FIG. 16 shows a lamp group 61 formed by arranging a plurality of lamps 82 in the form of a honeycomb. The lamps 82 themselves are those having cylindrical filaments similar to those in the aforementioned third embodiment, and the point that the plurality of lamps 82 are arranged in the form of a honeycomb is also identical to the third embodiment. While the symmetry axis XR passes through the central lamp 82 (see FIG. 10) in the lamp group 81 according to the third embodiment, however, the symmetry axis XR passes through a position having no lamp 82 in the lamp group 61 shown in FIG. 16.

Referring to FIG. 16, the lamp group 61 has 3-fold rotation symmetry about the symmetry axis XR. Also with such a lamp group 61, it follows that uniformity of radial illuminance distribution on the substrate W is improved and temperature uniformity of the substrate W in heat treatment can be ensured for a reason similar to that described above with reference to the above embodiment when displacing the symmetry axis XR of the lamp group 61 and the rotation axis XW of the substrate W.

Thus, not only the lamp group 81 shown in the aforementioned embodiment but lamp groups of various arrangement patterns can be applied so far as the lamps are arranged to have n-fold rotation symmetry (n: natural number of at least 2) about a certain symmetry axis.

While the plurality of lamps 82 are arranged in the form of a plane to form the lamp group 81 in the aforementioned embodiment, all lamps 82 may not be completely arranged in the form of a plane but the plurality of lamps 82 may have slight vertical positional relation as a matter of course, so far as the lamp group has an arrangement pattern arranged to have n-fold rotation symmetry as viewed from the substrate W to be treated.

While the substrate W is rotated in the aforementioned embodiment, the lamp group may alternatively be rotated about its symmetry axis. In this case, an effect similar to that of the aforementioned third embodiment can be attained when displacing the symmetry axis of the lamp group and the central axis of the substrate W. In other words, the substrate W and the lamp group may be in relatively rotated relation.

While the invention has been shown and described in detail, the foregoing description is in all aspects illustrative and not restrictive. It is therefore understood that numerous modifications and variations can be devised without departing from the scope of the invention.

What is claimed is:

1. A heat treatment apparatus rotating a substrate and irradiating said substrate with light for performing heat treatment, comprising:
   a lamp group having a plurality of lamps, each irradiating said substrate with light, arranged to have n-fold rotation symmetry (n: natural number of at least 2) about a prescribed symmetry axis; and
   a rotation driving part rotating said substrate about a rotation axis substantially parallel to said symmetry axis, wherein
   said symmetry axis and said rotation axis are displaced along a direction substantially parallel to the surface of revolution of said substrate; and
   wherein said symmetry axis and said rotation axis are displaced by at least $\frac{1}{5}$ and not more than $\frac{1}{2}$ the interval of arrangement of said plurality of lamps.

2. The heat treatment apparatus according to claim 1, wherein
   said plurality of lamps are arranged substantially in the form of a plane,
   said symmetry axis is perpendicular to said plane, and
   said surface of revolution of said substrate is substantially parallel to said plane.

3. The heat treatment apparatus according to claim 2, wherein
   each of said plurality of lamps is a cylindrical lamp, and
   said plurality of lamps are arranged in the form of a honeycomb in said lamp group.

4. A heat treatment apparatus rotating a substrate and irradiating said substrate with light for performing heat treatment, comprising:
   a lamp group having a plurality of lamps, each irradiating said substrate with light, arranged to have regularity about a prescribed symmetry axis; and
   a rotation driving part rotating said substrate about a rotation axis substantially parallel to said symmetry axis, wherein
   said symmetry axis and said rotation axis are displaced along a direction substantially parallel to the surface of revolution of said substrate; and
   wherein said symmetry axis and said rotation axis are displaced by at least $\frac{1}{5}$ and not more than $\frac{1}{2}$ the interval of arrangement of said plurality of lamps.

* * * * *